(12) United States Patent
Hurlbut

(10) Patent No.: US 9,054,491 B1
(45) Date of Patent: Jun. 9, 2015

(54) SOLID-STATE COHERENT ELECTROMAGNETIC RADIATION SOURCE

(71) Applicant: Walter C. Hurlbut, Eugene, OR (US)

(72) Inventor: Walter C. Hurlbut, Eugene, OR (US)

( * ) Notice: Subject to any disclaimer, the term of this patent is extended or adjusted under 35 U.S.C. 154(b) by 95 days.

(21) Appl. No.: 13/763,733

(22) Filed: Feb. 10, 2013

Related U.S. Application Data

(60) Provisional application No. 61/597,624, filed on Feb. 10, 2012.

(51) Int. Cl.
*H01S 3/04* (2006.01)
*H01S 5/10* (2006.01)

(52) U.S. Cl.
CPC .................................. *H01S 5/1071* (2013.01)

(58) Field of Classification Search
USPC .......................... 372/4, 34, 92, 94, 69, 81, 82
See application file for complete search history.

(56) References Cited

U.S. PATENT DOCUMENTS

| | | | |
|---|---|---|---|
| 7,525,711 B1 | 4/2009 | Rule et al. | |
| 7,741,933 B2 | 6/2010 | Duwel et al. | |
| 7,745,790 B2 | 6/2010 | Chowdhury et al. | |
| 7,826,504 B2 | 11/2010 | Chen et al. | |
| 7,847,739 B2 | 12/2010 | Achour et al. | |
| 7,855,696 B2 | 12/2010 | Gummalla et al. | |
| 7,864,394 B1 | 1/2011 | Rule et al. | |
| 7,876,793 B2 | 1/2011 | Gorrell et al. | |
| 7,928,900 B2 | 4/2011 | Fuller et al. | |
| 7,940,228 B1 | 5/2011 | Buckley | |
| 7,965,750 B2 | 6/2011 | Masui et al. | |
| 7,986,113 B2 | 7/2011 | Gorrell et al. | |
| 2010/0289715 A1 | 11/2010 | Cummer et al. | |
| 2010/0301971 A1 | 12/2010 | Yonak et al. | |
| 2011/0026624 A1 | 2/2011 | Gummalla et al. | |
| 2011/0169405 A1 | 7/2011 | Baik et al. | |
| 2011/0175672 A1 | 7/2011 | Nguyen et al. | |

OTHER PUBLICATIONS

Juan Domingo Baena et al. "Equivalent-Circuit Models for Split-Ring Resonators and Complementary Split-Ring Resonators Coupled to Planar Transmission Lines" IEEE Transactions on Microwave Theory and Techniques, vol. 53, No. 4, Apr. 2005. pp. 1451-1461.*
Zhengli Han et al. "Electrostatic MEMS Tunable Split-Ring Resonators for THz Filter Applications" Optical MEMS and Nanophotonics 2013, Kanazawa, Japan, Aug. 18-22, 2013. pp. 165-166.*
Amir Ghobadi et al. "Complementary Spiral Resonators for Ultrawideband Suppression of Simultaneous Switching Noise in High-Speed Circuits" Progress in Electromagnetics Research C, vol. 46, 117-124, 2014. pp. 117-124.*
Ferran Martin et al. "Application of RF-MEMS-Based Split Ring Resonators (SRRs) to the Implementation of Reconfigurable Stopband Filters" Sensors 2014, 14, pp. 22848-22863; doi:10.3390/s141222848.*

* cited by examiner

*Primary Examiner* — Colleen A Matthews
*Assistant Examiner* — Delma R Forde
(74) *Attorney, Agent, or Firm* — Northwest IP Law Group, LLC

(57) ABSTRACT

Solid state devices are provided for advantageously generating substantially coherent electromagnetic radiation. Electromagnetic waves in one or more desired frequency ranges, including terahertz, infrared, or visible light, can be generated using the ring-down mode of a splint-ring resonator (SRR). Present devices can offer tunable output frequencies by employing a biasing voltage to vary the carrier concentration of the dielectric of a capacitor for the SRR.

19 Claims, 27 Drawing Sheets

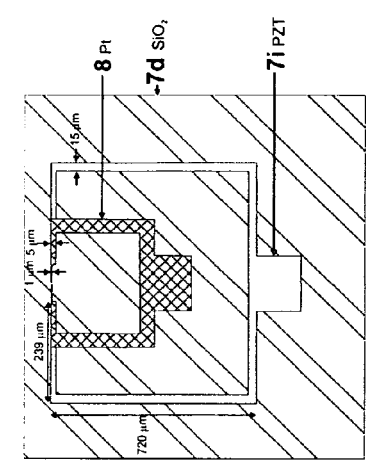
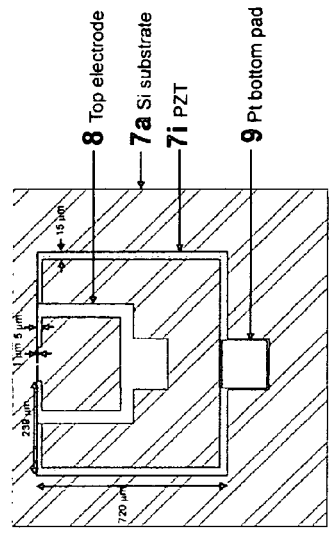
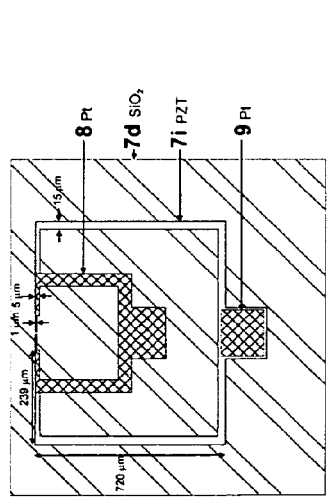

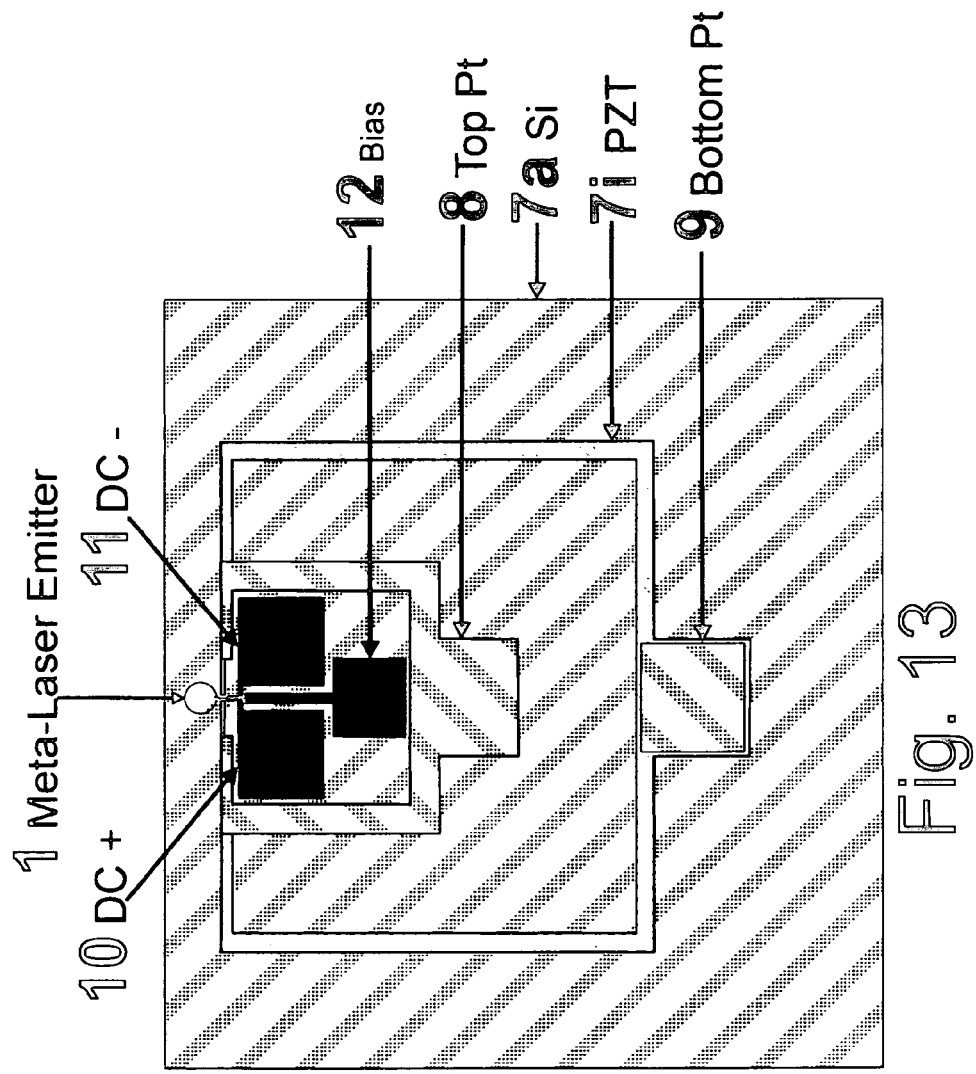

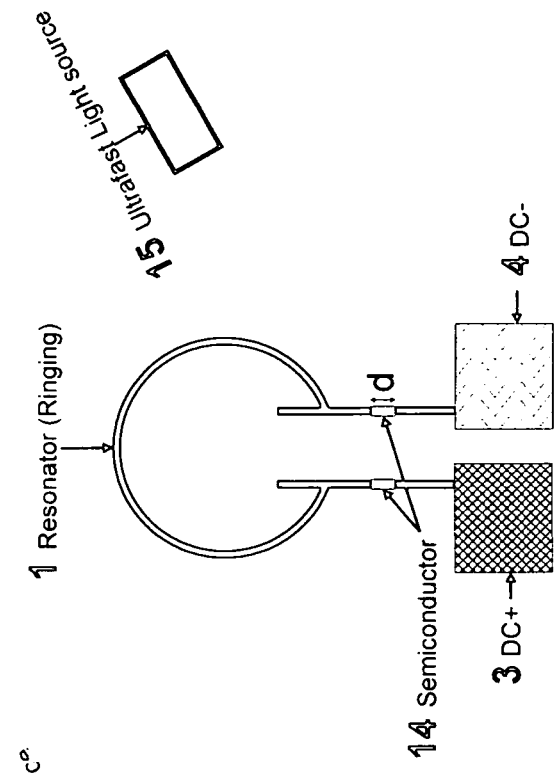
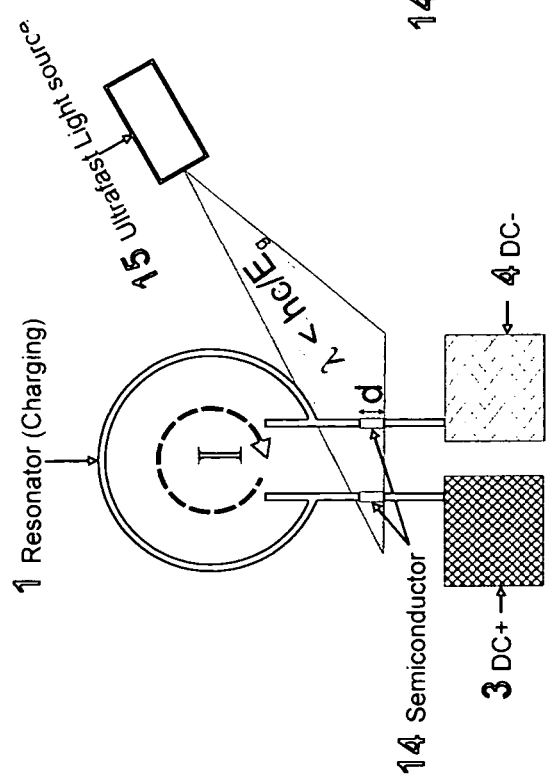
Fig. 19A
Fig. 19B

SOLID-STATE COHERENT ELECTROMAGNETIC RADIATION SOURCE

RELATED APPLICATIONS

This application is a nonprovisional of, and claims the benefit of priority from, U.S. Provisional Patent Application No. 61/597,624, filed Feb. 10, 2012, which is hereby incorporated by reference in its entirety.

COPYRIGHT NOTICE

© 2013 Walter C. Hurlbut, Ph.D. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright whatsoever. 37 CFR §1.71(d), (e).

TECHNICAL FIELD

The present application relates generally to the field of solid-state sources for coherent electromagnetic radiation, and, in particular, to employing the ring-down mode of a split-ring resonator to generate substantially coherent electromagnetic waves at one or more desired frequencies.

BACKGROUND

There are many potential uses for coherent electromagnetic radiation sources. While there are uses for electromagnetic radiation at various frequencies, there exists particular promise for sources generating waves in the terahertz (THz) frequency range, generally identified as the electromagnetic spectral range above microwave frequencies and below the far infrared frequencies.

Two main areas of interest in the use of terahertz waves are in the fields of imaging and spectroscopy. Imaging is useful for many applications. However, presently, the dominant market demand on imaging is for security applications. Being at such a low frequency (compared to X-ray) THz waves are significantly safer to use as they do not ionize tissue. However low power and/or low frequency of available sources has limited the resolution. Still the use of THz scanner instead of X-ray scanners has driven this market forward in spite of the lack of convenient and effective sources. Because many materials are transparent to THz waves, such as paper, clothing, semiconductors, and plastics, non-destructive evaluation of such items as the Styrofoam on the space shuttle fuel tank, semiconductor wafers, and wood have been performed. Additional potential imaging uses can include such things as identification of skin cancer, as well use in covert operations to read sealed letters without opening them.

Spectroscopy predominantly has been a research market to date. In spectroscopy, the identification of many compounds, such as the explosives RDX, C-4, and Semtex, has been demonstrated due to the fact that many materials have fundamental rotation and vibration transitions in the THz range. THz radiation has been used to study thin film materials including superconductive devices. Additionally, electrical characterization of semiconductors, showing the dopant levels and purity, has been demonstrated. Water vapor, carbon dioxide, and carbon monoxide content in the exhaust gasses of automotive and jet engines has been studied to determine combustion efficiency. Coherent control of dark states in semiconductor samples has been demonstrated opening another possibility in the development of quantum computing and optical computing.

The ability to do multi-spectral imaging (combining the two) is a recent promising development of broadband sources. However, known optical sources are of very low spectral brightness and therefore are very limited in methods of detection. However, multi-spectral imaging systems have demonstrated the ability to recognize the difference between several different drugs hidden in a suitcase without opening the case. Pharmaceutical companies can employ multi-spectral THz imaging to inspect the quantity and purity of their products as quality control.

There are many additional potential uses for THz radiation, such as studying plasmas in experimental fusion reactor devices, identifying droughts by non-destructively examining the water content in a tree's wood, and even non-destructively examining paintings for hidden underlying works. Unfortunately, many potential uses have had their development or implementation prohibited due to the lack of suitable sources. While there are known terahertz sources in existence, these existing sources are bulky, have inconvenient operating parameters, or are limited in their output power and/or frequency range (e.g., many cannot reach above 2.2 THz, etc., as but one example of an applicable present limitation on known sources).

Previously, the production of terahertz waves has proven to be difficult, as the terahertz spectral range is above microwave in frequency, and thus too high for conventional electronic methods, while being very low in the far infrared range, making the frequencies difficult to generate via optical techniques. In electronic devices, the scale of the physical components is very small, making accurate construction difficult for devices such as backwards wave oscillators (BWOs)[1], traveling wave tubes, Gunn diodes, and Shottky diodes[2] used as multipliers fed by either microwave sources or BWOs. While it is possible to build a gas laser to produce discrete lines in the THz range, such devices are bulky as the required low pressure, strict temperature control, and long interaction path length from the pump laser limit how small such devices can be built[3]. In semiconductor laser devices the energy equivalent to photons in the THz range is in the milli-electron-volt range (1 THz~4.3 meV) and the equivalent temperature to 1 THz is 48° K. Therefore, a semiconductor device, in which the charge carriers drop in voltage in steps, known as a "quantum cascade laser" (QCL)[4], uses cryogenic cooling to allow fixed frequency device construction. As an alternative approach, optical parametric oscillators (OPOs) performing difference frequency generation between the signal and idler in a non-centro-symmetric crystal, such as gallium arsenide, can be used to build a tunable source which is table top sized; but, such source requires precise alignment and constant adjustments. Unfortunately, this requires significant operating expertise and considerable effort on the part of the user[5]. Additionally, there are two types of broadband THz sources both based on nonlinear interactions using ultra-short pulses in the near or mid-IR range to generate THz in non-centro-symmetric crystals or photoconductive switches.

[1] W. C. Hurlbut, V. G. Kozlov, "Extended spectral coverage of BWO combined with frequency multipliers", conf. proceedings Photonics West, 2010.
[2] T. W. Crowe, J. L. Hesler, R. A. Retslov, et. al., "Solid state LO sources for greater than 2 THz", 2011 ISSTT digest, 22$^{nd}$ symposium on space terahertz technology, 2011.
[3] E. R. Mueller, "Optically-pumped THz laser technology", Coherent lasers Inc.
[4] B. S. Williams, "Terahertz quantum-cascade lasers", Nature Photonics, Vol. 1, September 2007
[5] P. F. Tekavec, W. C Hurlbut, V. G. Kozlov, et. al., "Terahertz generation from quasi-phase matched gallium arsenide using a type-II ring cavity optical parametric oscillator", Cong. Proceedings Photonics West, 2011.

While some electronic terahertz-generation devices have been developed in recent years, few are narrow band and tunable. Of the few that are narrow band and tunable, they tend to group into three classes: electronic, semiconductor opto-electronic, and nonlinear optical sources. With the electronic sources, invariably as one goes to higher frequency generation, the construction of a suitable device becomes more and more difficult and power levels drop to microwatt levels by 1.5 THz. Producing power below 4.3 THz using QCLs (the second category) requires liquid nitrogen or colder cryogenic cooling as the thermal vibration of the cavity degrades the resonance of the cavity to the point there is no resonance to establish the cascade effect if the temperature is not reduced below the equivalent temperature of the THz photons to be generated. While QCLs can generate mW power levels, the cryogenic requirements make them difficult to work with and commercially these are not feasible below 1 THz. Nor are they tunable. While the third category can run at room temperature, can be tuned, and systems with up to 2.9 mW output have been built, the alignment and operational difficulties along with the required stability (e.g., suspended optical tables, etc.) to avoid vibration, which reduces or eliminates power output and can change the frequency (mode hopping) make these systems impractical for industrial and security applications.

It is worth noting that terahertz waves see significant attenuation due to water vapor absorption across most of the spectral range. There are, however, known windows where the atmospheric absorption due to water vapor is minimized. These occur at 0.65, 0.85 and 1.5 THz[6]. Therefore, these frequencies are desired operating frequencies for fixed frequency long range THz devices. Fixed frequency devices such as Gunn diodes can be constructed for the lower two of these frequency windows with mW power levels. However, the upper one is out of bounds of fixed electronic devices. QCLs can operate at the uppermost window, but, as previously mentioned, require cryogenic cooling and typically producing 10 s of microwatts of power.

[6] L. S. Rothman, HITRAN database, Atomic and molecular physics division, Harvard-Smithsonian center for astrophysics, 2008.

Among known tunable devices, BWOs and Schottky diode chains on high power microwave sources can operate at the lower frequency windows. However, the more desirable (due to the shorter wavelength) frequency of 1.5 THz is beyond the range of BWOs. Additionally, it is a range where Schottky diode devices make only 10 s of microwatts of power. While OPOs can operate in any of these ranges, the typical power is less than 1 mW, and they exhibit previously mentioned alignment and stability disadvantages.

More recently, hot microbolometer cameras and pin diode cameras have become available in the THz range from vendors such as NEC[7], INO[8], Traycer[9]. Disadvantageously, these cameras typically have noise equivalent power (NEP) between 10 and 100 pW per pixel element. Therefore, to conduct imaging with a 1000 pixel-element camera and have a minimum of 100:1 contrast ratio would require a source of 10 mW average power.

While it has been known since the 19th century[10] that RLC electrical circuits will oscillate in a well-known manner based on the values of the resistance, R, capacitance, C, and the inductance, L; use of said devices as a source has largely been ignored because the disparity between wavelength and device size coupled with the impedance mismatch to free space result in very low coupling of electrical power to electromagnetic radiation at frequencies into the microwave spectral range. In 1996 it was discovered that split-ring resonators, a specific type of RLC circuit, make good antenna arrays in the microwave and higher frequency regimes[11]. These arrays are commonly called meta-materials as the split-ring resonator is considered a "meta-particle" with an engineered absorption spectrum. When placed into a periodic two dimensional array, this lattice structure is referred to as a 2-D meta-material. Such meta-materials are known to act as strong absorbers when designed and operated in the terahertz frequency range (between 100 GHz and 10,000 GHz).[12] However, an antenna that has strong reception capacity also generally presents a good design for a broadcast antenna. This is due to the requisite strong coupling between the free space wave propagation and the electrical signal, which is an identical process of impedance matching and scaling for both transmission and reception.

[7] N. Oda, M. Sano, K. Sonada, et. al., "Development of terahertz focal plane arrays and handy camera", Conf. proceedings SPIE Infrared technology and applications, Apr. 25, 2011.
[8] M. Bolduc, M Terroux, B. Tremblay, et. al., "Noise-equivalent power characterization of an uncooled microbolometer-based THz imaging camera", Conf. proceedings SPIE
[9] H. L. Mossbacker, J. Alverbro, Z. Zhang, et. al., "Initial test results for a real-time 80×64 pixel, 600 GHz-1.2 THz imager", Conf. proceedings IRMMW-THz 2011, Oct. 2-7, 2011.
[10] J. C. Maxwell, A Treatise on Electricity and Magnetism, Dover (1904).
[11] Pendry, J. B.; Holden, A. J.; Robbins, D. J.; Stewart, W. J., "Magnetism from conductors and enhanced nonlinear phenomena". IEEE Transactions on Microwave Theory and Techniques 47 (11): 2075.
[12] B. Jitha, C. S. Nimisha, C. K. Aanandan, P. Mohanan, K. Vasudevan, "SRR loaded waveguide band rejection filter with adjustable bandwidth", Microwave Opt. Technol. Lett. 48: 1427-1429, 2006.

Having recognized this, scientists around the world have attempted to develop an active meta-material device[13]. The main efforts have been to use a laser source to nonlinearly couple energy so that an incoming signal is amplified. The reason for this seemingly less direct approach is due to several issues for standard semiconductor methods of electrical stimulation, such as the high capacitance that electrically coupling these devices would provide, effectively lowering the spectral operating range below the optimal coupling range of the device, and the THz absorption that would result from the presence of highly doped semiconductors inside the meta-material[14].

[13] H.-T. Chen, W. J. Padilla, J. M. O. Zide, et. Al., "Active terahertz metamaterial devices," Nature 444, 597 (2006).
[14] H.-T. Chen, A. K. Azad, J. F. O'Hara, et. Al., "Active Terahertz Metamaterials", Conf. Proceedings IRMMW-THz 2011, Tu-1.2, 2011.

While solid state sources in the THz, far-infrared, and mid-infrared ranges do exist in the form of quantum cascade lasers, they are limited to a very narrow tuning range and require cryogenic cooling[15]. In the wavelength range shorter than approximately 5 μm through the visible range, semiconductor lasers have been developed; but, they also are of limited tuning range[16].

[15] B. S. Williams, "Terahertz quantum cascade lasers", Nature Photonics, vol. 1, September 2007.
[16] P. Zorabedian, F. J. Duarte., Tunable Lasers Handbook, Academic Press, 1995.

SUMMARY

Applicant has discovered several potential advantages that may be afforded by providing a new class of solid-state sources for electromagnetic radiation. Such sources can be electrically powered/pumped and can be fixed-frequency and/or selectively tunable within a desired frequency range. Those skilled in the art of constructing and operating sources for generating electromagnetic radiation will appreciate that a room temperature, solid-state device or solid-state/opto-electronic hybrid narrow band device with output in the mW range would be highly advantageous, especially for generating waves in the THz frequency range. Additionally, fixed-frequency devices, and/or tunable device with a broad range of tuning would be useful as sources of electromagnetic radiation in the infrared and visible light ranges as well. The present subject matter presents meta-lasers suitable for satisfying these needs. As disclosed herein, a meta-laser device can be constructed as a specialized RLC circuit that can be optimized electronically for high power, narrow band, fixed, and/or tunable frequency production, acting as a broadcast antenna.

In particular, solid state devices can be constructed and provided for advantageously generating substantially coherent electromagnetic radiation in one or more desired frequency ranges, including terahertz, infrared, or visible light, by employing the ring-down mode of a splint-ring resonator (SRR). Present devices can offer tunable output frequencies by employing a biasing voltage to vary the carrier concentration of the dielectric of a capacitor for the SRR. Present device embodiments can encompass an under-damped RLC electronic circuit constructed so the electric field in the capacitor and the magnetic field generated by the inductor are orthogonal thus defining an axis of electromagnetic wave propagation when in free electrical oscillation. A low capacitance high speed switching mechanism can be provided to charge the circuit and release it into operation.

The present application describes examples of design and manufacturing processes for constructing multiple alternative embodiments of meta-lasers suitable for generating substantially coherent waves in the THz, IR, and visible-light frequency ranges. As described in more detail herein, embodiments can include novel approaches and/or designs for electrically pumping split-ring resonators to function as fixed-frequency and/or electronically tunable solid-state sources of coherent electromagnetic radiation. One or more embodiments of such devices can be power-scalable and combinable to function as linear edge emitting arrays, with a power output that can be made scalable through parallel synchronous operation of multiple elements spaced appropriately. Additionally, by offering a potentially large available tuning range, these novel devices can be substantially versatile enough for operation in numerous industrial and/or commercial applications.

Additional aspects and advantages of the present subject matter will be apparent from the following detailed description of preferred embodiments, which proceeds with reference to the accompanying drawings.

BRIEF DESCRIPTION OF THE DRAWINGS

FIG. 12 shows switch electrode construction in accordance with the present invention; a) Top electrode and switch actuation input circuit (8) is patterned by cutting down to PZT layer (7i) through top platinum (7j). b) Bottom electrode and switch actuation circuit is patterned by cutting down to the top SiO₂ Layer (7d) through the PZT and the bottom platinum layer (7e-i). Note the contact block is the same dimensions for both top and bottom layers (100 μm×μm). c) A wet etch process opens up the bottom electrode contact block (9) by removing the PZT from the top of the contact (7i). d) etching opens up the silicon substrate (7a);

FIG. 13 shows channels (solid black-1, 10-12) for circuits and contact blocks cut into the silicon to a depth of 637 nm.

FIG. 19 shows optoelectronic switch actuated Meta-Laser operation in accordance with the present invention, with metal-semiconductor-metal (MSM) opto-electronic switch a) Switch On state: photo-responsive semiconductor in photo-conductive mode charging up the circuit b) Switch Off state: semiconductor acting as insulator isolating circuit to ring down lasing mode;

DETAILED DESCRIPTION

Figure 1:
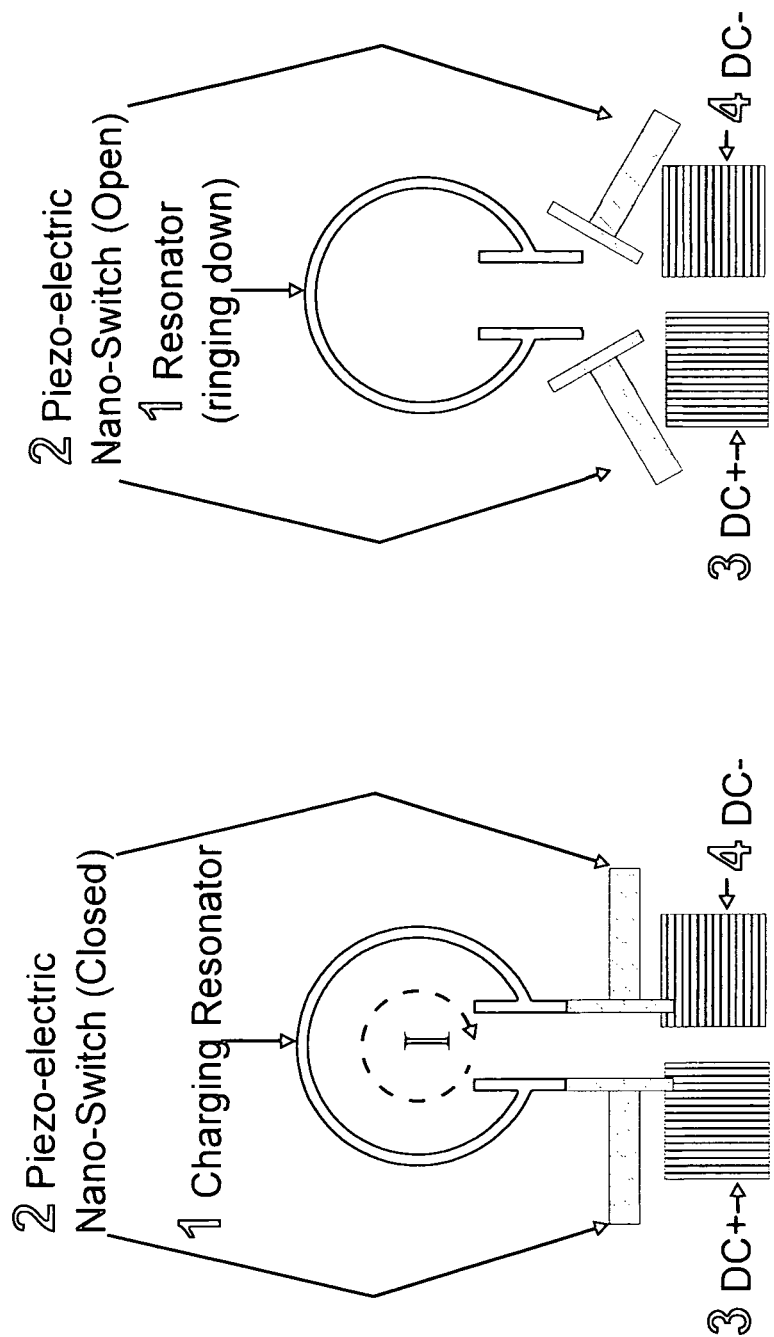
FIG. 1 illustrates a basic schematic of one embodiment Meta-Laser a) in charging mode, and b) operating in ring-down mode.

In the present disclosure, multiple alternative embodiments are shown and described for illustrative purposes. It should be readily appreciated that alternative embodiments of the subject matter presented herein are capable of being embodied and/or implemented in various other combinations, environments, and/or applications, using fewer, additional, or alternative components to those specifically described and shown herein for illustrative purposes. Such modifications are equally deemed within the scope of the claimed subject matter.

The applicant for the present application has identified a need for improved solid-state sources for substantially coherent electromagnetic radiation in spectral ranges such as the terahertz, infrared, and visible light frequencies. In particular, there are many promising potentially advantageous applications of waves in the terahertz (THz) range. As THz waves are well-known to penetrate cloth, paper, semiconductors, and plastics as transparent materials, there is interest in industry for using terahertz waves for non-destructive evaluation (NDE) and security screening, to name but two potential fields of use. For example, THz waves have been used to image skin cancer[17], leaves[18] and other biological as well as numerous other materials and devices. As THz waves are non-ionizing and don't penetrate the endodermal layers of the skin (due to water content), security use in commercial airports and secured facilities is one example of a highly desired application. Further, a compact, portable, easy-to-use system would further enable fire fighters to see through smoke and desert security forces to see through sand storms[19]. In the case of a significantly high powered (e.g., >approximately 2 watts) broadband or tunable narrowband (~10 mW) sources with sufficient spectral range between 1.5 and 3 THz, one could do hyper-spectral imaging in real time, which would substantially both obtain an image and facilitate simultaneous identification of the materials present in the image. As most explosives (TNT, C-4, Semtex for example)[20] and drugs have fundamental vibrational transitions in the 1.5 to 3 THz range, such imaging capabilities are believed to be would be highly desirable for security and defense applications.

[17] R. M. Woodward, B. E. Cole, V. P. Wallace, et. al., "Terahertz pulse imaging in reflection geometry of human skin cancer and skin tissue", Physics in Medicine and Biology, Vol. 47 (21), 2002.
[18] J. C. Iriarte, D. Etayo, I Palacios, et. al., "Water content evolution in leaves based on active terahertz imaging", Conf. proceedings Antennas and Propagation (EUCAP), Apr. 11-15, 2011.
[19] D. A. Wikner, "Progress in millimeter-wave imaging", Conf. proceedings SPIE, Feb. 16, 2011.
[20] J. F. Federici, B. Schulkin, F. Huang, et. al., "THz imaging and sensing for security applications-explosives, weapons, and drugs", Semiconductor Science and Technology, Vol. 20 (7), 2005.

Accordingly, embodiments encompassing a room temperature solid state device or solid state/opto-electronic hybrid narrow band device with output in the mW range would be highly advantageous in the THz range. Similarly, one or more embodiments of a fixed-frequency device and/or tunable device with a narrow or broad range of tuning would be useful in the infrared and visible-light ranges as well. The following description presents multiple alternative embodiments of meta-lasers suitable for these and other desirable applications.

One or more embodiments of the present subject matter can be constructed to provide a source of coherent electromagnetic waves, at least in part, by employing the ring-down mode of a split-ring resonator (SRR). Such device embodiments substantially comprise specialized RLC circuits substantially optimized electronically for high-power, fixed, narrow band, broad band, and/or tunable frequency production. In a present SRR embodiment, the resonator can be charged up by connecting it to a DC electrical power source for a relatively short period of time by a low capacitance switching mechanism such as two MEMS piezoelectric switches (FIG. 1a) where the time, $t_{off}$ is ultrafast (<100 femtoseconds) for applications ≤10 THz. In an alternative embodiment, a different type of suitable high-speed switch could be used. For example, one such alternative embodiment can employ optoelectronic switches (e.g., MSM or photoconductive switches, etc.) using a semi-insulating direct band gap material such as undoped gallium arsenide as an alternative switching mechanism with sufficiently short $t_{off}$ of less than the ring-down period of the radiation to be produced (for example, ≤100 attoseconds for the visible/IR example of the device). After charging up the SRR, the switches can be opened, thus allowing the SRR to go into ring-down mode (FIG. 1b).

FIG. 1 shows a basic schematic of one embodiment metalaser a) in charging mode and b) operating in ring-down mode. With specific reference to FIG. 1, 1 represents the split-ring resonator that acts as the emitter, 2 is the piezoelectric nanoswitch, 3 is the positive voltage direct current source to power the device, and 4 is the return electrical path for 3.

Figure 2:
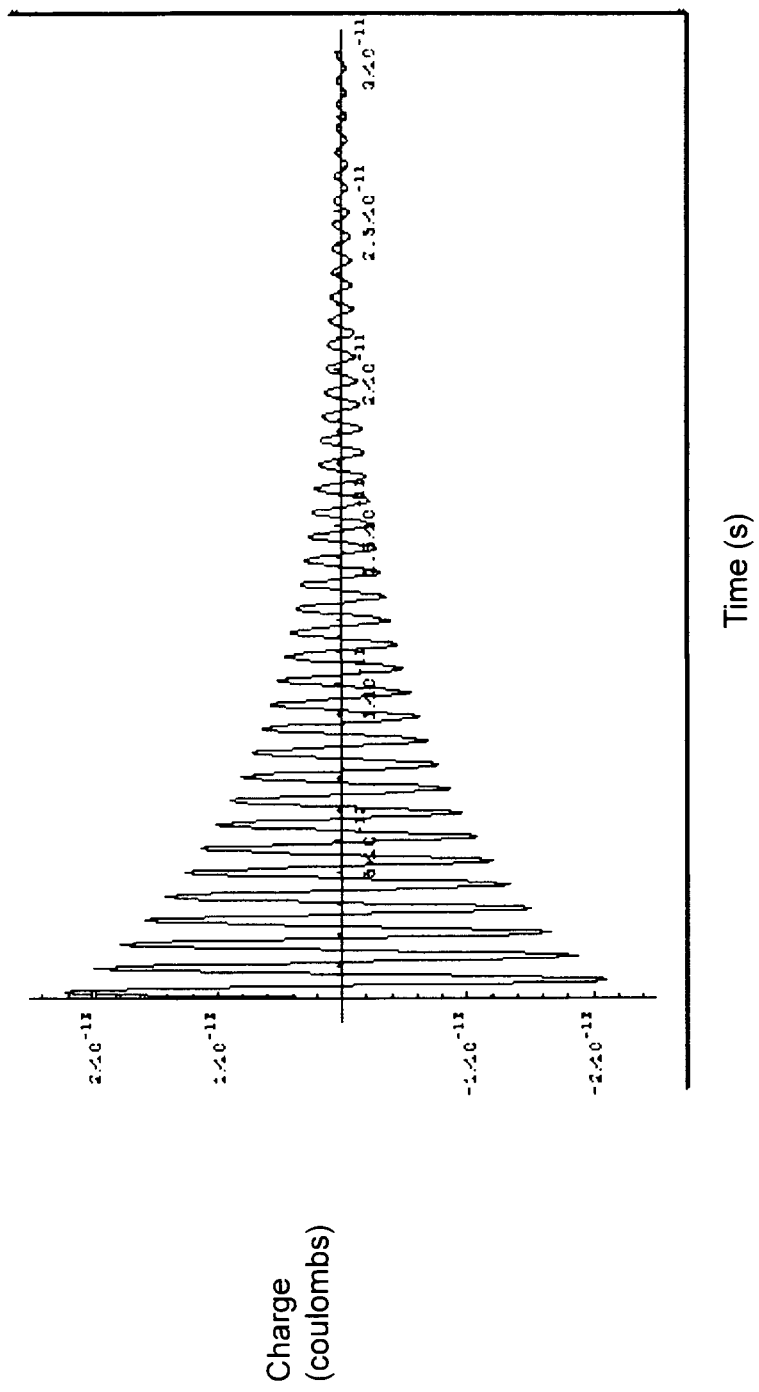
FIG. 2 shows a theoretical model of the ring-down charge on the capacitor from a 10 V input in a device designed for 1.5 THz production.

The following description is provided for further illustration of the theoretical support for the detailed illustrative embodiments subsequently described. The theoretical underpinnings are presented for facilitating discussion, and are not meant as limitations on the claimed subject matter. Accordingly, and without wishing to be bound by theory, it is believed that when the SRR is ringing down it rings down according to a formula relating the inductance, capacitance, and resistance to the ringing frequency.

$$v = \frac{1}{2\pi}\sqrt{\frac{1}{LC} - \frac{R^2}{4L^2}} \tag{1}$$

Where v is frequency, L is inductance, C is capacitance, and R is resistance. L is completely determined by the geometry of the inductor. C is determined by the geometry of the capacitor and the dielectric properties of the intervening material. Resistance is from the conductive properties and the geometry of the inductor. So by appropriately configuring and scaling the size of the device, a given frequency can be generated. When the circuit is opened, the energy stored in the device begins oscillating back and forth in the ring-down of the circuit. The ring-down charge on the capacitor (FIG. 2) can continue for a relatively significant time when the resistance is substantially low, as with a metal device that is short and has a large conductor. This also has the advantage that more power can be injected at a lower voltage.

Figure 3:
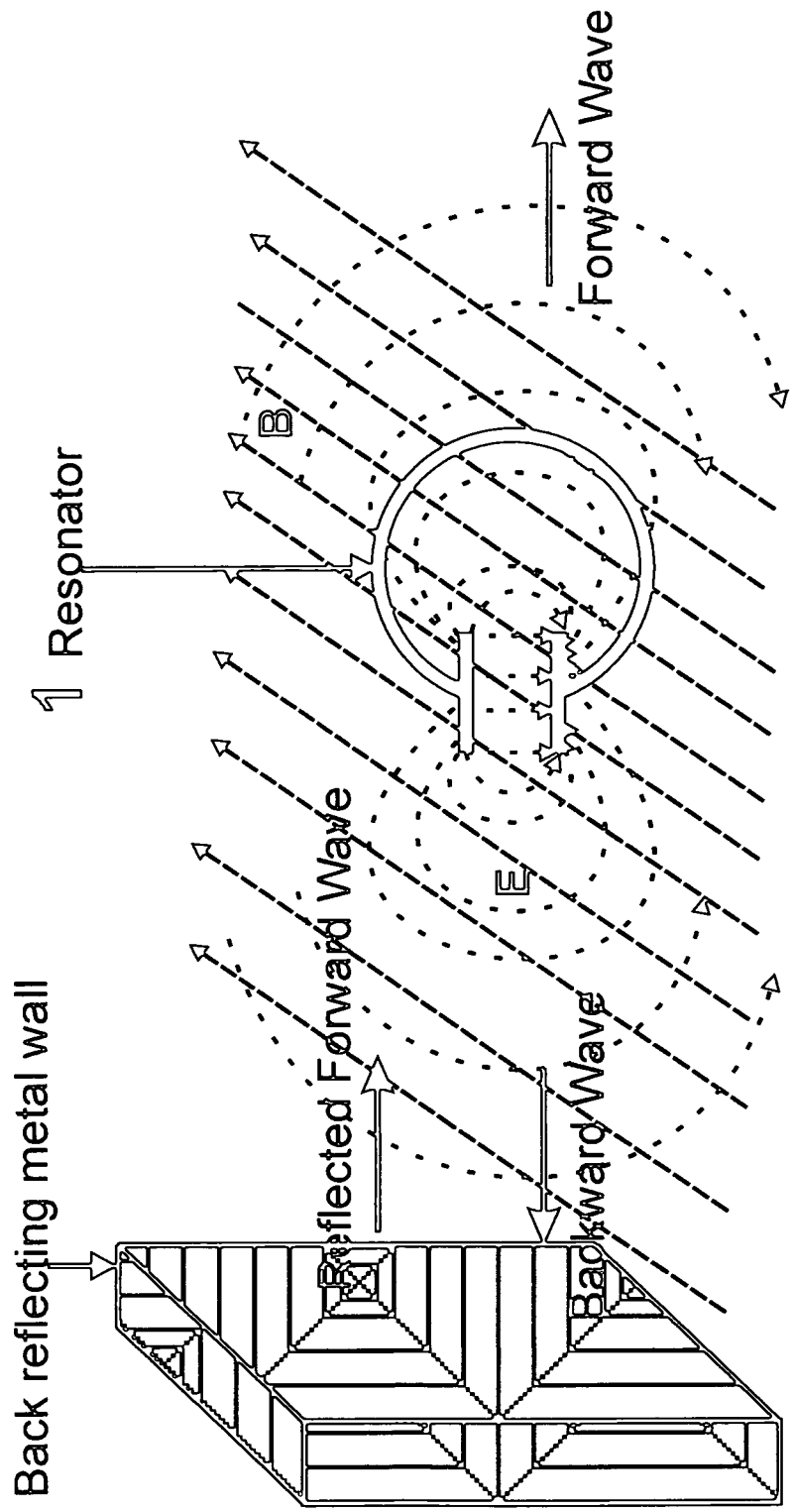
FIG. 3 shows that a split-ring resonator generates vertical electric fields and horizontal magnetic fields radiating out as a forward and backward propagating wave. The backward wave is reflected forward increasing the output.

The oscillating electric and magnetic fields generated are not limited to the neighborhood of the device so changing fields are radiated. By choosing the design of an SRR, the magnetic field and the electric field are perpendicular (FIG. 3). Engineering the device properly by, at least in part, choosing the appropriate spacing between the center of the inductor and the center of the capacitor, one fixes the phase relationship between the fields so any elliptical polarization (including linearly polarized, etc.) can be generated.

In one or more embodiments of the present invention, the electric and magnetic fields are arranged so that the Poynting vector, which points the direction of electromagnetic wave propagation, is in the direction away from the capacitor and towards the loop (upward, as illustrated in FIG. 1). However, as some of the radiation may back-propagate due various mechanisms, such as interface reflection, a metal wall placed at the appropriate distance behind the device can reflect the backward propagating waves into a forward direction. By choosing the distance between the SRR and the wall so that ringing is completing when the back-reflected wave returns, a significant portion of the backwards wave can be recovered into an extended pulse train. In the 1.5 THz case where the ringing is 30 ps long this requires a spacing of 4.5 mm between circuit and metal reflecting wall. Of course, those skilled in the art will appreciate that one or more alternative structures or methodologies for reflecting the back-propagated wave could also be employed consistent with the present subject matter and to achieve the intended result.

Turning to the capacitance of the parallel plates in the SRR, at high frequencies, below the band gap in a semiconductor, then a simple model for the dielectric function is [Jackson 7.51 ch. 7 pg 310]:

$$\epsilon(\omega) = \epsilon_0 + \frac{ne^2}{m_e} \sum_j \frac{f_j}{\omega_j^2 - \omega^2 - j\omega\gamma_j} \quad (2)$$

Where e is the dielectric function, $\epsilon_0$ is the vacuum permittivity, n is the carrier density, e is the charge of an electron, $m_e$ is the mass of an electron, $f_j$ is the strength of the oscillator, $\omega_j$ is $j^{th}$ resonant frequency, $\omega$ is the angular frequency of operation, and $Y_j$ is the damping term.

In some embodiments the device is designed so that the transitions are far from the operating frequency. Then, for materials with band gaps larger than the operating frequency, the change in operating frequency has little effect and one can replace the summation with a constant. The simplified form of equation (2) becomes:

$$\epsilon(\omega) = \epsilon_0 + \frac{n\sigma^2}{m_e \overline{\omega}^2} \quad (3)$$

Where $\overline{\omega}^2$ varies slightly with frequency. The principle dependence of the dielectric material in the capacitor is with change in carrier concentration.

By introducing an impurity with more electrons in its outer shell (n-doping) in small quantities into the semiconductor layer between the electrodes of the capacitor and hooking it to an electrical voltage not connected to the charging or switch driving circuits, the carrier concentration in the dielectric of the capacitor can be adjusted. Use of a small barrier region of undoped semiconductor between the doped region and the capacitor electrodes to prevent a leakage current can help improve performance of the device. The capacitance of a parallel plate capacitor is:

$$C(\omega) = \text{Re}[\epsilon(\omega)] \frac{A}{d} \quad (4)$$

Where A is the cross sectional area of an interior capacitor face, and d is the separation distance between the faces. Defining the area, A, in the SRR capacitor as length, l, and thickness, t, and inserting (4) into (1) results in:

$$v = \frac{1}{2\pi} \sqrt{\frac{1}{L\left(\epsilon_0 + \frac{ne^2}{m_e\omega^2}\right)\frac{lt}{d}} - \frac{R^2}{4L^2}} \quad (5)$$

Figure 4:
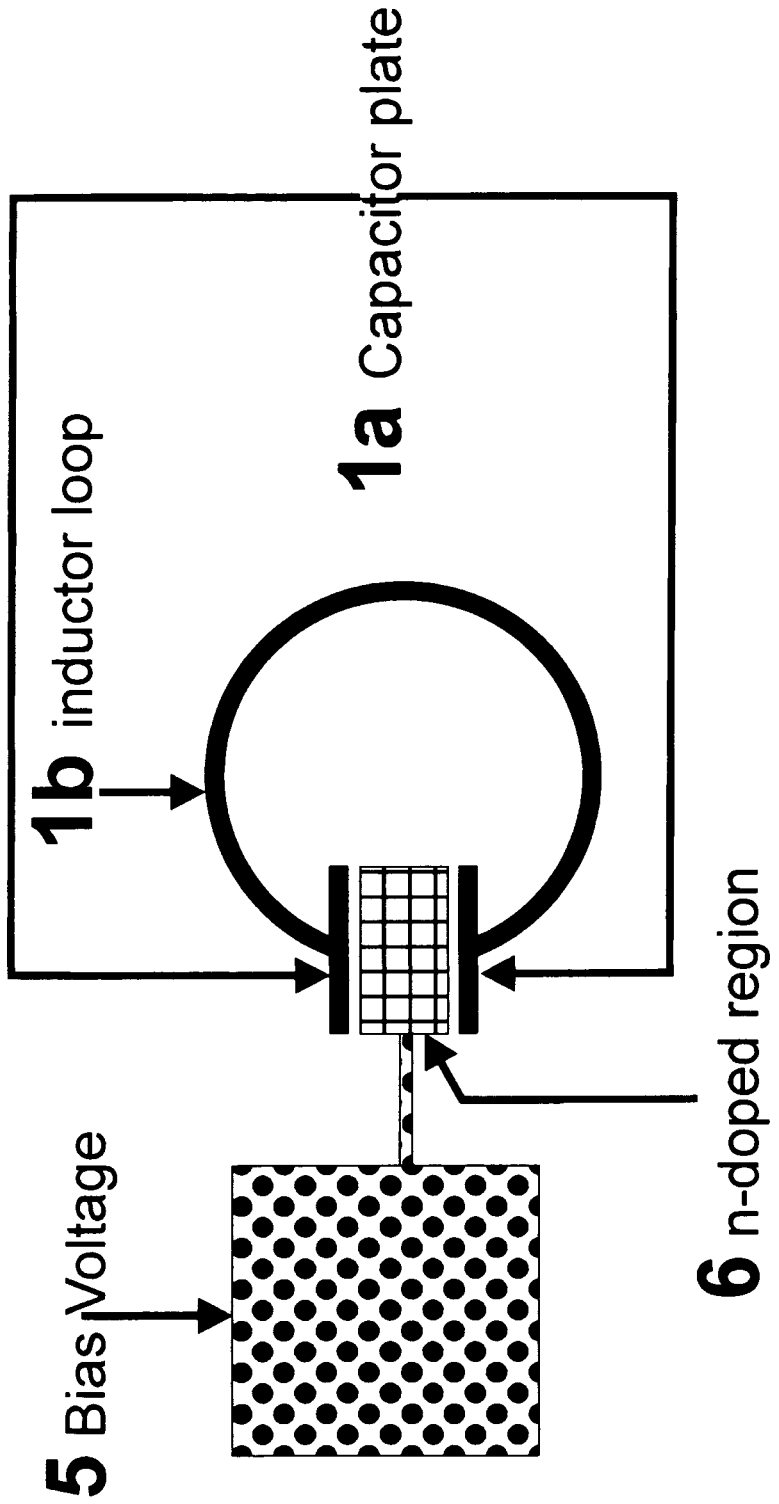
FIG. 4 shows that a doped region (6) between capacitor electrodes (1a) provides higher capacitance with no bias. As the bias voltage (from 5) increases capacitance drops causing the operating frequency to increase.

By changing the carrier concentration, the resulting output frequency can be changed. This makes the device substantially tunable (FIG. 4). The n-doped region can be connected to an adjustable positive bias voltage source so that by adjusting the bias voltage, carrier depletion of the region can be changed, which accordingly results in a corresponding change of the ring-down frequency.

Figure 5:
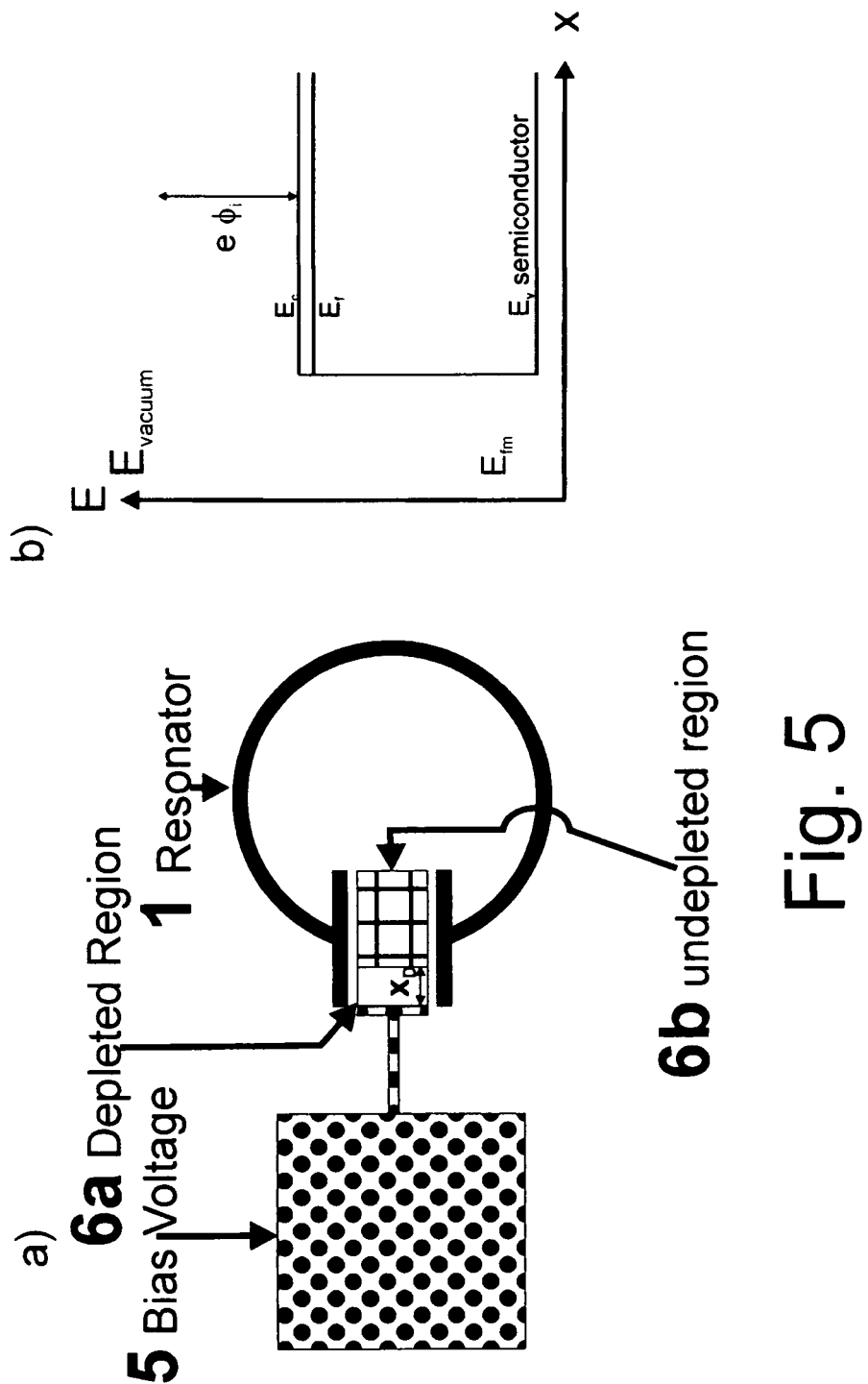
FIG. 5 shows a) a diagram showing the undepleted (6b) and depleted regions (6a); and b) Energy diagram showing the built-in potential.

The carrier depletion in such embodiments is not uniform across the doped region. In fact, it forms two regions. One region remains n-doped at the unbiased level, and the other becomes charge-depleted as if undoped. This is because the junction of a conductor and a doped region will substantially behave as a Schottky diode. The capacitance of the device is the sum of the capacitance of the doped and undoped regions. The size of the undoped region varies in length along the direction perpendicular to the boundary interface (FIG. 5) according to the relationship[21]:

$$x_d = \sqrt{\frac{2\epsilon(\omega=0)[(\phi)_i + V)}{ne}} \quad (6)$$

[21] B. Van Zeghbroeck, Principles of electronic devices, Univ. of Colorado, 2011.

Where $x_d$ is the length of the undoped region, $\epsilon(\omega=0)$ is the DC dielectric constant, $\phi_i$ is the built-in potential of the Schottky diode junction, and V is the applied voltage.

Modifying equation 5 to account for capacitance of both regions one obtains:

$$v = \frac{1}{2\pi} \sqrt{\frac{1}{L\left(\left(\epsilon_0 + \frac{n_D e^2}{m_e \overline{\omega}^2}\right)\frac{x_{vt}}{d} + \left(\epsilon_0 + \frac{n_{uD} e^2}{m_e \overline{\omega}^2}\right)\frac{(l-x_D)_t}{d}\right)} - \frac{R^2}{4L^2}} \quad (7)$$

Where $n_D$ and $n_{uD}$ are the depleted and undepleted region carrier concentrations respectively.

For design and engineering purposes one needs appropriate geometric and material property formulas for the inductance, L, and the resistance, R as well. In the case of inductance, the exact formulation for a square wire partial single loop requires a finite element method[22] to calculate the exact value. However, an acceptable first order approximation can be made by conformally mapping to the approximate solution for a thin round wire single loop provided the parameter, a, is more than a factor of 5 times smaller than the loop radius. Then using $$a = \frac{2}{\pi}t$$

as the conformally mapped wire parameter preserving cross sectional surface area one obtains the approximation:

$$L = \mu \frac{\phi}{2\pi} r \left( \ln\left(\frac{8r}{a}\right) - 2 \right) \quad (8)$$

[22] Y. Yuan, C. Bingham, T. Tyler, "Dual-band planar electric metamaterial in the terahertz regime", Opt. Exp. Vol. 16 (13), 2008.

Where μ is the permeability of the substrate, φ is the angle corresponding to the split-ring size, and r is the center radius of the split-ring.

For calculating resistance, R, using the high frequency volume resistivity for the conductor used, one can directly calculate the resistance as:

$$R = \frac{\rho \phi r}{a \sqrt{\frac{2\rho}{\mu \omega}}} \quad (9)$$

Where, in the above equation, p is the high frequency volume resistivity.

Illustrative Theoretical Basis for Calculating Antenna Efficiency

Again, without wishing to be bound by theory, and without limitation on the claim subject matter, the following is presented for purposes of facilitating discussion. In order to calculate the antenna efficiency of one or more source embodiments as disclosed herein, one can begin by determining both the radiated power and the input power. Input power is easily calculated from Ohms' Law, taking the duty cycle of the switching mechanism into account. Because the device free-oscillates at the resonant frequency where impedance is minimized to the electrical resistance, the input power per pulse is:

$$P_{in} = \frac{V^2}{R_{rf}} \frac{t_{on}}{T_{SN}} \quad (10)$$

Where, in the above equation, V is the input voltage, R is the electrical resistance of the input path at the switching frequency, $t_{on}$ is the closed contact time for the switches, and $T_{sw}$ is the switching period.

Calculating the radiated power is a little more involved. On initial inspection one would expect the magnetic field component to be the more difficult term, however to first order this is generally not the case. To demonstrate, let us first consider the induced magnetic field contribution due to the capacitor. One can do so, at least in part, by considering the displacement current, $I_D$, which can be calculated from Maxwell's equations.

$$\nabla \times \vec{H} - \vec{j} + \epsilon \frac{\partial \vec{E}}{\partial t} \quad (11)$$

One can readily identify the displacement current density, $J_D$, as the furthest right term. Integrating over the cross sectional area of the capacitor yields:

$$\vec{I}_D = \int \vec{j_D} dA = \epsilon \int \frac{\partial \vec{E}}{\partial t} dA \quad (12)$$

If a coordinate system is defined wherein x is the axis of propagation, y is the axis normal to the capacitor plates and z is the axis through the center of the partial loop then between the capacitor plates the −y direction is equivalent to the φ direction to first order. Ignoring edge effects for the magnetic field as this is to first order, the electric field, $\vec{E}$ can be defined as:

$$\vec{E} = \frac{V(t)}{d} \hat{\phi} \quad (13)$$

Where V(t) is the voltage across the capacitor during operation. Inserting this result and performing the integration one obtains:

$$\vec{I}_D = -\frac{\epsilon a^t}{d} \frac{\partial V(t)}{\partial t} \hat{\phi} = C \frac{\partial V(t)}{\partial t} \hat{\phi} = \vec{I}(t) \quad (14)$$

$\vec{I}(t)$ is the current in the partial loop current. This effectively closes the loop. One can use the solution for a single circular loop as a magnetic dipole antenna to calculate the magnetic field for the emitter device.

The magnetic dipole, $\vec{m}$, is[23]:

$$\vec{m} = \pi r_a^2 I(t) \hat{\theta} \quad (15)$$

[23] J. D. Jackson, Classical electrodynamics, John Wiley & Sons, 3rd edition, 1998.

Where I(t) is the current in the circuit.

In the far field, the magnetic field, $\vec{H}$, and the magnetically induced electric field, $\vec{E}_{ind}$, are:

$$\vec{H} = \frac{1}{4\pi} \left(\frac{k^2}{r}\right) \pi r_o^2 I(t) e^{ike} \hat{e} \quad (16a)$$

$$\vec{E}_{ind} = \frac{Z_0}{4\pi} k^2 \pi r_o^2 I(t) \frac{e^{ikr}}{r} \hat{\phi} \quad (16b)$$

where $Z_o$ is the free space impedance, and k is the free space magnitude of the wave vector.

Next, the far field contribution to the electric field, $\vec{E}_{cap}$, from the capacitor can be determined using the electric dipole calculation. First, we can calculate the dipole, $\vec{p}$. To do this we determine the charge density, ρ.

$$\rho = \frac{q(\tau)}{2al} \odot \left(\frac{l}{2} - r_{cap} - x\right) \odot \left(\frac{l}{2} + r_{cap} + x\right) \odot \quad (17)$$

$$\left(\frac{a}{2} - z\right) \odot \left(\frac{a}{2} + z\right) \left[\delta\left(y - \frac{d}{2}\right) - \delta\left(y + \frac{d}{2}\right)\right]$$

Where $r_{cap}$ is the distance from the loop center to the capacitor center. Then, the dipole is:

$$\vec{p} = \int \vec{x} \rho dx^2 = q(t) d\hat{y} \quad (18)$$

The electric field, $\vec{E}_{cap}$, is then:

$$\vec{E}_{cap} = \frac{Z_0 c k^2}{4\pi} q(t) d \left(\cos(\theta)\sin(\phi)\hat{\theta} + \cos(\phi)\hat{\phi}\right) \frac{e^{ikr'}}{r'} \quad (19)$$

Where $r' = r + r_{cap}$ and $r_{cap}$ is the separation distance between the center of the circular loop and the center of the capacitor. Then the time averaged power per unit solid angle, $dP/d\Omega$, is:

$$\frac{dP}{d\Omega} = \frac{V^3}{R_{THz}} \frac{z_0 k^4 r_0^2}{16\pi} \left(\frac{cd}{\omega}\cos(\phi)|\cos(kr_{cap})| + \pi r_0^2 \sin^2(\theta)\right) e^{-\frac{K_{THz}t}{L}} \quad (20)$$

This gives the radiated power per unit angle as a function of the time envelope. Integrating over the solid angle can give the radiated power as a function of the time envelope. Integrating over the time of a single pulse we can arrive at the radiated power per pulse and from that the efficiency, η, can be calculated as:

$$\eta = \frac{Z_0 k^4 r_0^2 L}{8R_{THz} t_{on} R_{rf}} \left(\frac{cd}{\omega} \cos(\phi)\cos(kr_{cap}) + \frac{\pi r_0^2}{4R_{THz}}\right) \quad (21)$$

Note the term $R_{THz}$ is used to distinguish the resistance at the operating frequency of the emitter.

First Illustrative Embodiment

For illustration, and not by way of limitation, a first illustrative embodiment of the present subject matter can be configured as a tunable terahertz wave generation device employing piezoelectric switching mechanisms to generate variable frequency waves ranging from approximately 500 GHz to approximately 3 THz. In this first embodiment, designed to operate substantially within the THz range, the device can be built on a substrate such as a silicon substrate, as but one example. In high resistivity silicon, the permittivity in the neighborhood of 1.5 THz is approximately 12 $t_0$. Accordingly, the carrier concentration dominates the real part of the dielectric function. Solving for the undoped resonance to be at 3 THz one finds that the parameters t=637 nm, r=10=μm, l=2.5 μm, capacitor electrode width is 1 micron, and φ=5.92469 radians are a valid set of parameters for silicon.

For a device designed to operate at 500 GHz, when unbiased, requires the carrier concentration, $r_D$, such that $$\frac{10^{14}}{cm^2} < n_D < \frac{3 \times 10^{15}}{cm^2}.$$

Figure 6:
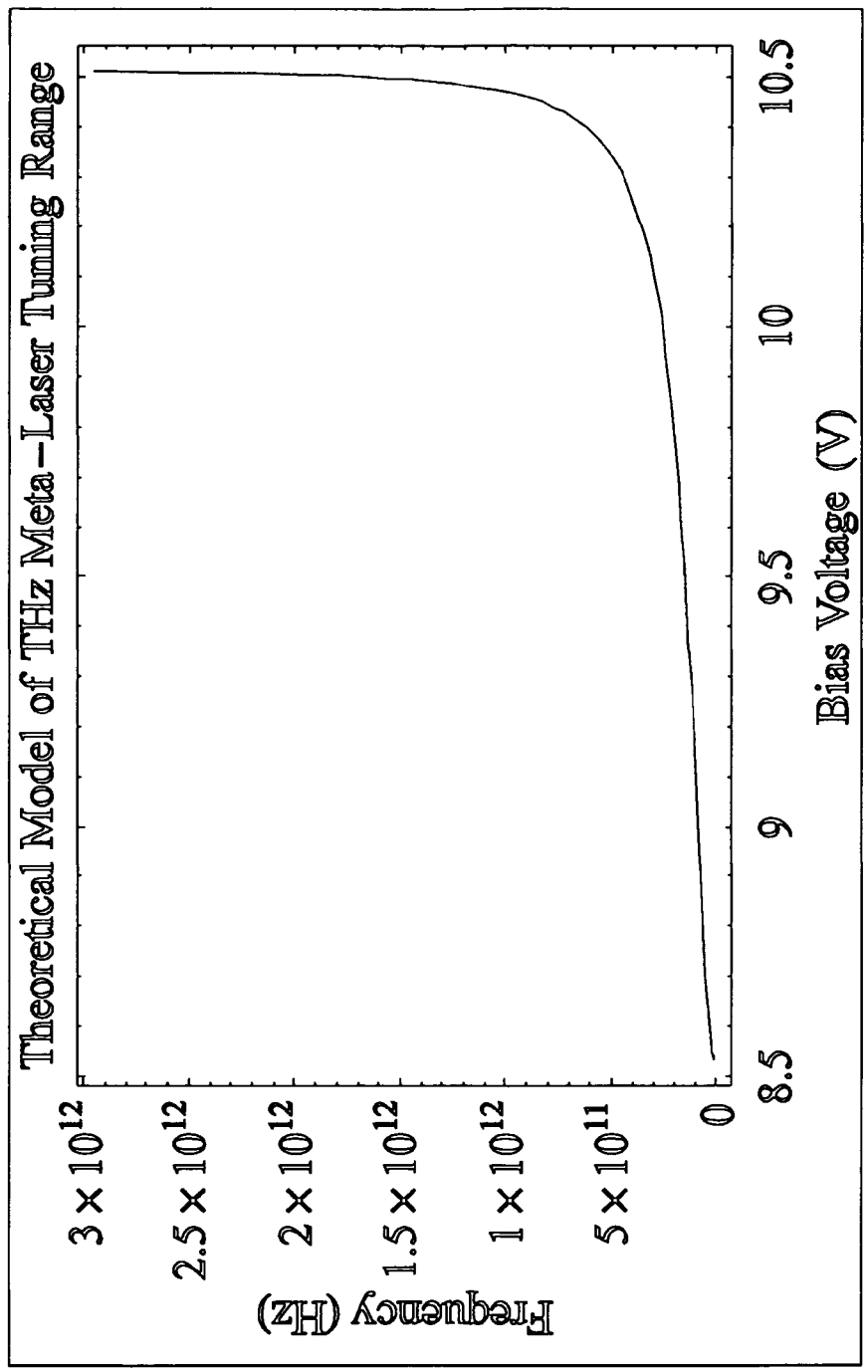
FIG. 6 shows a model according to the present invention showing output down to 8.53 V bias. However, analysis of the charge oscillation shows a single cycle with 10% amplitude in the latter half of the first period doesn't occur until 9.5 V bias corresponding to 152.5 GHz.

Then the tuning voltage range is approximately 120 to 220 mV to tune from substantially 500 GHz to 3 THz. For example: if $$n_D = \frac{3 \times 10^{15}}{cm^2}$$

then the voltage range is approximately 10.3 to 10.511 V for the targeted tuning range. The theory predicts tuning can go to lower frequencies as can be seen in FIG. 6.

Figures 7A, 7B:
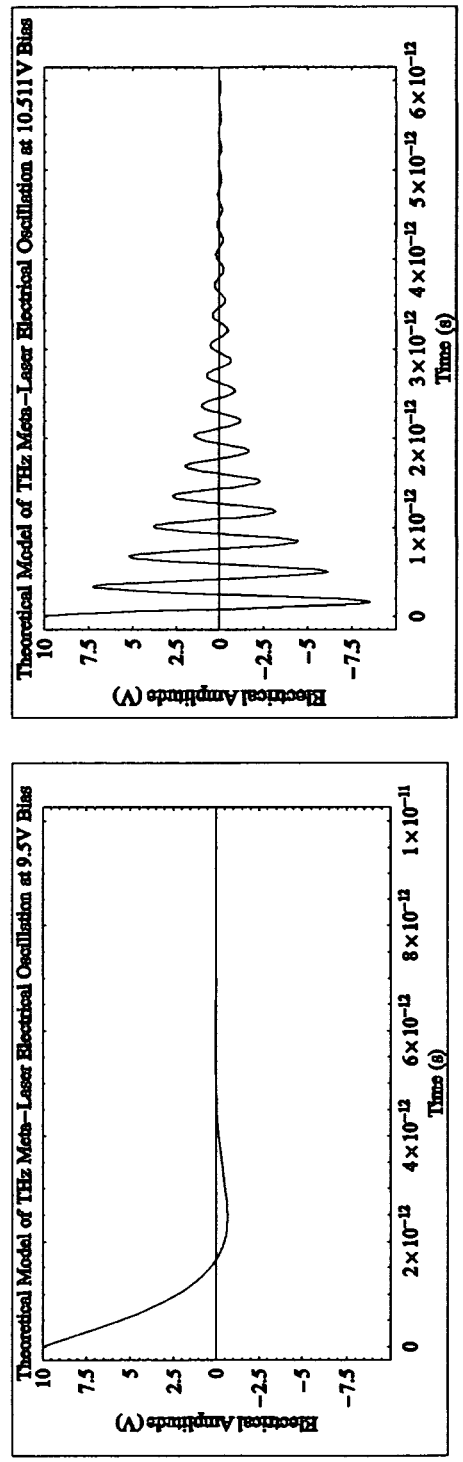
FIG. 7 shows modeling of the electrical oscillation when driven at 10 V for a THz Meta-Laser with a) 9.5V bias b) 10.511 V bias.

Temporal modeling of circuit operation shows that the device can operate better as the frequency increases towards the maximum (Equation 10). This is due to the nature of the RLC circuit. These circuits reach highest under-damping at maximum frequency as only the capacitance is changed via tuning (resistance increases with the root of the frequency). While technically the circuit is operating in the underdamped regime down to approximately 8.53 V bias as designed, the operation doesn't reach 10% until approximately 9.5V bias. At approximately 10.511 V bias, where the frequency is maximum (3 THz in the present first example embodiment), the circuit undergoes numerous oscillations (see, e.g., FIG. 7).

$$q(t) = \left(q_0 + \frac{I_0}{\omega}\right)\cos(\omega t)e^{-\frac{Rt}{2L}} \quad (22)$$

An alternative to the doping level tuning presented here can be accomplished by applying an electric field to a ferroelectric material[24]. Those skilled in the relevant art will readily appreciate that any suitable additional or alternative method that can change the capacitance of the device can serve this function.

[24] Thomas H. Hand and Steven A. Cummer, "Frequency tunable electromagnetic metamaterial using ferroelectric loaded split rings", J. Appl. Phys. 103, 066105 2008.

The majority of the initial energy in the circuit is due to current at the moment of switch disconnect. This significantly improves efficiency by two orders of magnitude. For the THz MetaLaser operated with 80 W input power then there is 18.56V on the input with a 10% duty cycle at 3 THz tuning then the efficiency is $8.8 \times 10^{-4}$ and the produced power is 71 mW.

$$P_{THz} = P_{in}\eta = \left(\frac{V^2}{R_{rf}}\right) \frac{Z_0 k^4 r_0^2 L}{8R_{THz} t_{SW} R_{rf}} \left(\frac{cd}{\omega}\cos(\phi)\cos(kr_{cap}) + \frac{\pi r_0^2}{4R_{THz}}\right) \quad (23)$$

Figure 8B:
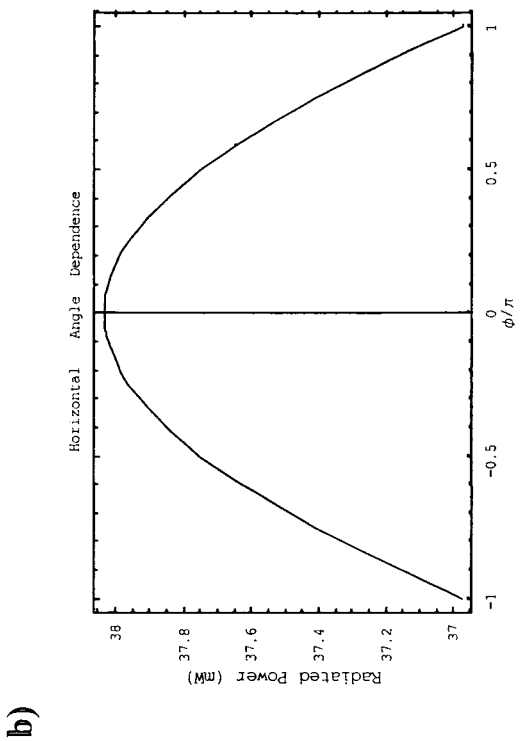
FIG. 8 shows angular radiation patterns for the THz Meta-Laser in accordance with the present invention operating at 3 THz. a) Vertical pattern as seen at $\phi=0$. b) Horizontal pattern at the forward direction ($\theta=\pi/2$)
Figure 8A:
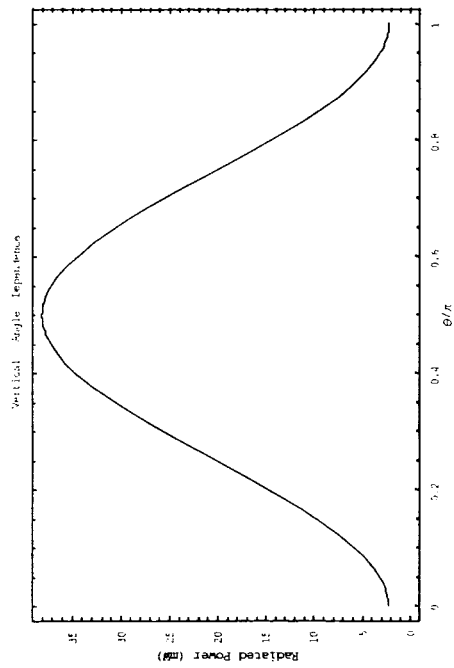

The radiation output is shown in FIG. 8.

Figure 9:
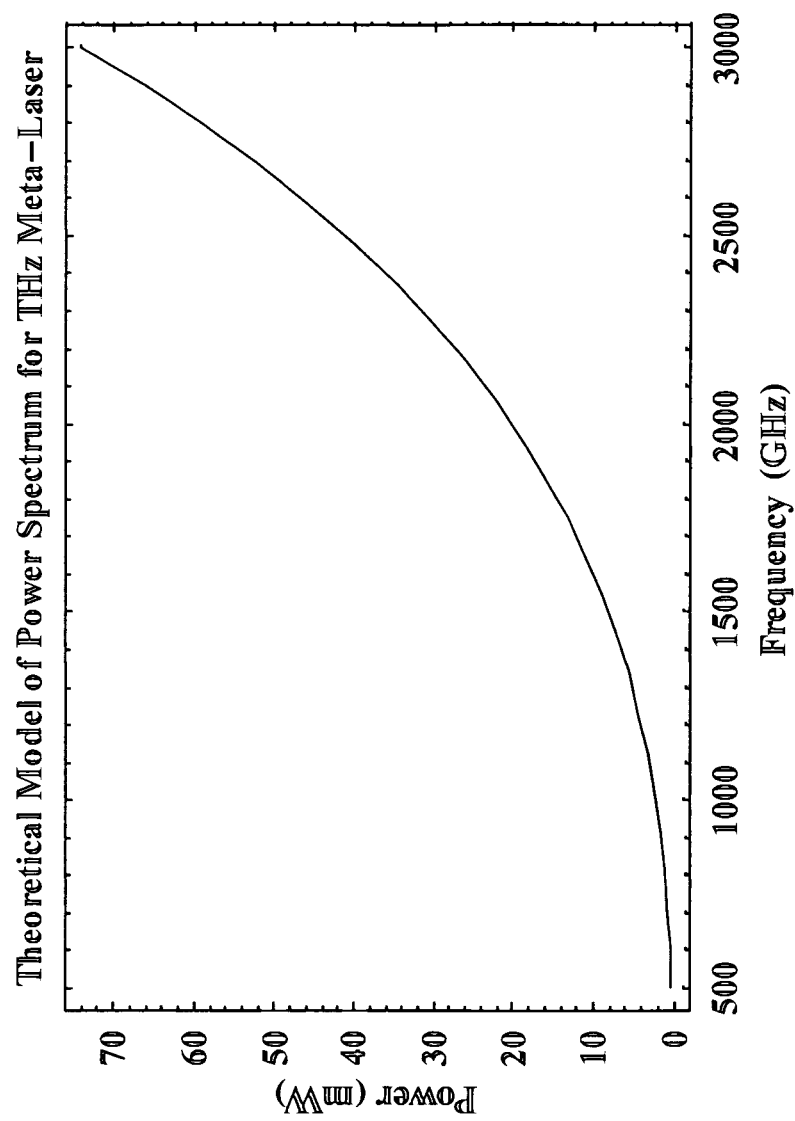
FIG. 9 shows a power spectrum for a THz Meta-Laser designed for 3 THz operation with piezoelectric nanoswitches and driven with the fixed voltage required for a peak of 80 W input in accordance with the present invention.

The power spectrum is modeled in FIG. 9 for 80 W input power. Note the minimum power occurs at approximately 500 GHz where the output is approximately 309 μW. Power reaches approximately 1 mW at approximately 752 GHz.

Electrical Power Input: Low Capacitance Switching Devices

For one or more present embodiments operating substantially in the 3 THz to 10 THz peak frequency range, consistent with the present subject matter, it is currently preferred to employ piezoelectric nanoswitch embodiments. However, with the requirements of capacitance sufficiently low (≤approximately 10% of the emitter capacitance) and a sufficiently short duration of off-switching time, $t_{off}$, (≤approximately 100 femtoseconds) for a suitably successful switch, alternative switch embodiments can be employed, as appropriate, to achieve the intended result. For example, two potentially suitable types of switch embodiments can include piezoelectric nanoswitches and/or optoelectronic switches. Both of these switches can be implemented with less than approximately 10% of the capacitance designed into the meta-laser emitter portion of the device. Design of the piezoelectric nanoswitches meeting this requirement is relatively direct and substantially straightforward for approximately 10 THz and below. There are many different known materials presently being used for optoelectronic switches, as they have large fields of application, including telecommunications, scientific detection and even THz generation.

In the piezoelectric switch, the contact pads for the 3 THz device are approximately 0.5 µm by 0.5 µm and each of the two switches can be designed to have two contacts. One contact is to the source or ground (depending on the switch) and the other is to the appropriate input point on the capacitor portion of the device. The separation distance is designed to be greater than approximately 180 nm when switched at approximately 10 MHz for a 10 µm long arm with 1 mm×1.269 mm cross section to the cantilever[25]. The switch contacts form 4 capacitors in series so the added capacitance to the device is $$\frac{1}{4}\epsilon_0 \frac{s^2}{d} = 3.07 \ 10^{-1s}F.$$

The minimum calculated capacitance in the emitter portion is $7.43 \ 10^{-17}$ F. This demonstrates that this embodiment of the piezoelectric nanoswitch meets the previously chosen design criteria for operation of the invention in the 3 THz embodiment.

[25] D. C. Judy, J. S. Pulskamp, R. G. Polcawich, and L. Currano, "Piezoelectric nanoswitch", IEEE 22$^{nd}$ Intern. Conf. on MEMS, March 27 (2009)

Figure 10:
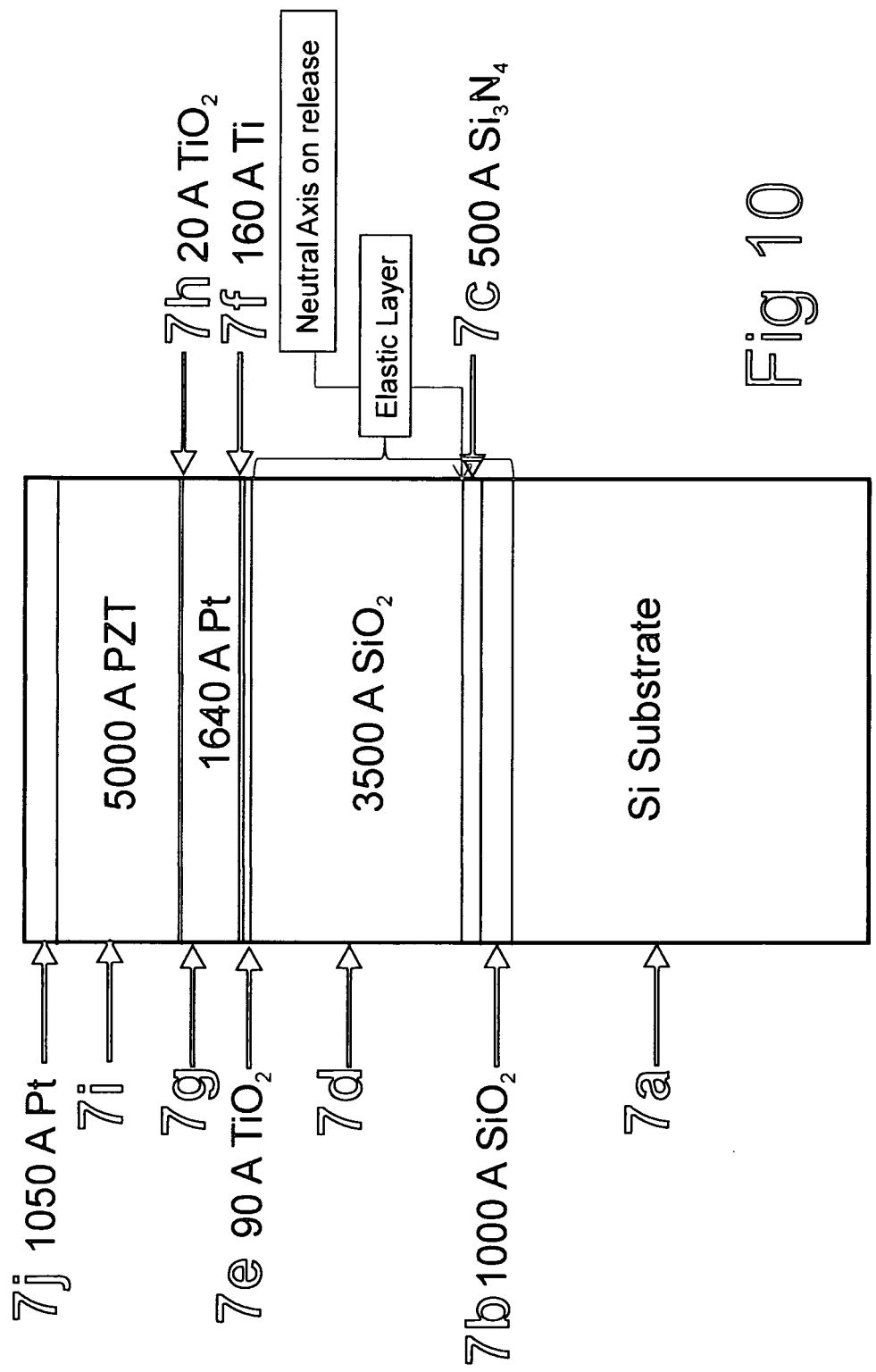
FIG. 10 shows stacked layers (7a-j) to be etched into the MEMS piezoelectric nanoswitch in accordance with the present invention.

One or more present embodiments of the piezoelectric nanoswitches can be designed as MEMS devices fabricated on a silicon substrate. In one such embodiment, presented for illustration and not by way of limitation, a piezoelectric nanoswitch can embody a multilayer stack comprised of Si substrate followed by, 100 nm $SiO_2$, 50 nm $Si_3N_4$, 350 nm $SiO_2$, 16 nm Ti, 9 nm $TiO_2$, 164 nm Pt, 2 nm $TiO_2$, 500 nm PZT, and 105 nm Pt from the bottom up (see, e.g., FIG. 10), each of which could be varied by ±approximately 10% in this switch design, or the entire switch may be scaled smaller by up to a factor of approximately 4.

Figure 11:
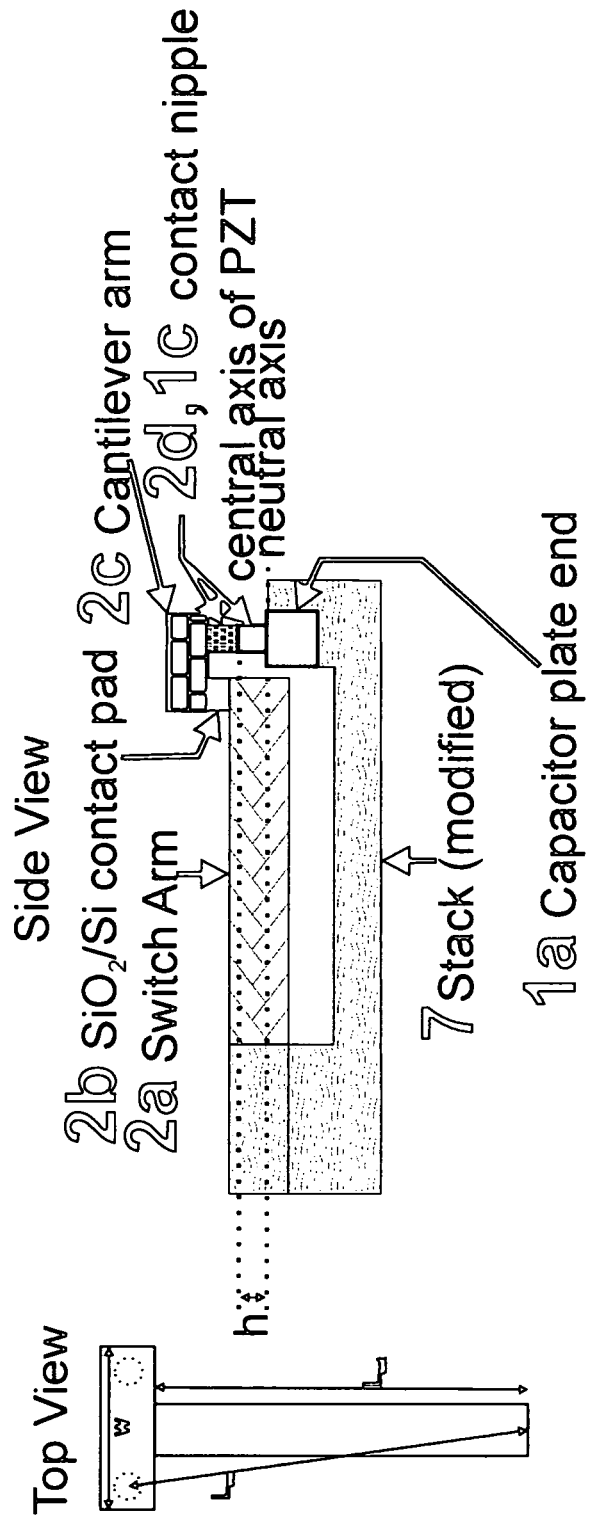
FIG. 11 shows the design and parameters of a piezoelectric nanoswitch (2a-d) in accordance with the present invention; where the closed switch electrically connects the DC electric source with one of the capacitor electrodes (1a).

The switches require approximately 6V to actuate. The geometry of the configuration is a cantilever arm approximately 10 µm long, 1 µm wide, and 1.269 µm thick. The switch can be actuated by applying a potential across the top and bottom Pt electrodes so that the electric field stresses the lead zirconate (PZT) between the electrodes. The resultant displacement separating the contacts can be determined as:

$$y = \frac{e_{31}(E)VwhL_{act}(2L_{su} - L_{act})}{2YI_{eff}} \quad (24)$$

Where $e_{31}$ is the field dependent effective piezoelectric stress constant, V is the applied voltage, w is the width if the top electrode, h is the distance between the structure's bending neutral axis and the midplane of the PZT layer, $L_{sw}$ is the distance from the anchor to the contact, $L_{act}$ is the length of the top electrode, and $YI_{eff}$ is the flexural rigidity of the composite structure (see, e.g., FIG. 11).

The switches can be provisioned and/or otherwise arranged on opposite sides of the capacitor with equal length connections to the electrical actuation signal. The contacts can connect a DC electrical source to the capacitor electrodes during the charging cycle, as shown in FIG. 1.

To illustrate one alternative embodiment of a switch, an optoelectronic switch can be configured and/or constructed as a channel of insulated undoped direct bandgap material such as GaAs or a diode device of photoresponsive material such as an InGaAs/Lt GaAs photodiode. Two of these devices can be arranged so as to connect the capacitor electrodes with the DC source and sink. When an intense optical source momentarily illuminates the photo-responsive material with a wavelength as short as, or slightly shorter than, the wavelength corresponding to a photon with the bandgap energy required for exciton formation (photo-ionization), then the surface of the material has free carriers generated, changing the surface into a conductor. In the case of GaAs the skin depth is typically approximately 1 micron, so the switch regions should be constructed to be under 1 micron thickness. The recombination time is on the order of femtoseconds, which can result in ultrafast switching, which is one of the desired operating conditions for the meta-laser to provide a sharp transition between conducting and insulating states. When the illumination is in an off state, the photo-responsive material acts as an insulator with resistance greater than approximately 10 MΩ, so the path acts as a capacitor. Thus, choosing an appropriately long path with square dimensions results in substantially the lowest capacitance, as per the other requirement of the meta-laser.

Continuing with the first illustrative meta-laser embodiment, configured to operate up to approximately the 3 THz range, the capacitance of the emitter is calculated as $7.43 \times 10^{-17}$ F, so the substantially minimum length for a material with dielectric constant of 12 and 637 nm of length per side of square wire material, such as semi-insulating GaAs suspended on a 50 nm outer casing of $SiO_2$, would be d=870 nm. So, currently the application of optoelectronic switches for THz Meta-Lasers is generally restricted to designs where the capacitance of the emitter is sufficiently large, as is the case for devices below approximately 2 THz peak frequency operation (as discussed in the third illustrative embodiment, presented below).

The carrier mobility of semi-insulating GaAs[26] is low enough that in the recombination time the charge carriers only travel approximately 100 nm. This generally limits the length to the point at which the capacitance in a device that would behave as a good conductor under illumination is approximately $6.46 \times 10^{-17}$. This current value of capacitance for the optoelectronic type of switch is generally unacceptable in the 3 THz Meta-Laser. However, for a device with the radius optimized for 1.5 THz generation (r=approximately 37.5 micron), a larger capacitor with a length of approximately 10 microns, and a gap of approximately 2.02 microns, with all other details unchanged, results in a device with sufficiently large capacitance (e.g., $2.69 \times 10^{-16}$ F) to construct a device utilizing optoelectronic switches operating from approximately 94 GHz to approximately 1.64 THz (encompassing the 1.5 THz range, which is advantageous as previously discussed). This demonstrates the acceptability of the optoelectronic switches currently available for at least <2 THz peak frequency devices such as the 1.5 THz and lower frequency version of the invention (see, e.g., the description with respect to the third illustrative embodiment below).

[26] Z.-M. Li, L. M. Veilleux, D. R. Conn, et. Al., "Analysis of a resonant-cavity enhanced GaAs/AlGaAs MSM photodector", IEEE Phot. Techn. Lett., Vol. 4, (5), May 1992.

There has been recent work improving the mobility while maintaining the short carrier lifetime, which has shown promise in applications for photoconductive switching[27], which would allow an approximately 400 nm long switch with its carrier mobility of approximately 4 times the typical GaAs value ($2\times10^3$ cm$^2$/V s). The mobility corresponding to construction of an acceptable MSM optoelectronic switch for the 3 THz device described earlier is $4.3\times10^3$ cm$^2$/V s. It is anticipated that within the next 1-2 years, optoelectronic switches will have progressed to the point that they may be suitable replacements for piezoelectric nanoswitches in embodiments encompassing 3-10 THz peak frequency applications, including, as but one example, the 3-THz-encompassing first illustrative Meta-Laser example presented above.

[27] R. J. B. Dietz, M. Gerhard, J. Boettcher, et. Al., "Photoconductive THz generation at 1.5 μm excitation in InGaAs/InAlAs structures with separated photoconductive and trapping layers", Conf. Proceedings IRMMW-THz 2011, M4A.4, 2011.

Replacing the piezoelectric nanoswitches with optoelectronic switches will present expected advantages over the mechanical approach, and that there will be reduced and/or no wearing parts. There are the additional advantages achievable by using one diode laser to operate a linear array of meta-laser devices. Additionally, laser diodes can switch at repetition rates far in excess of 10 MHz. Switching at 100 MHz would be a factor of 10 improvement in output power as output power is substantially linear with switching (power=energy/pulse*repetition rate). For this reason the optoelectronic switch can be readily employed with the lower frequency THz devices (Such as discussed in the third illustrative embodiment below), and it is highly anticipated for having advantageous applicability in approximately 3 THz and higher applications of the present subject matter. Optoelectronic switches can also be used for the optical Meta-Laser application (discussed as the second illustrative embodiment below) as the ratio of wire cross section to path length improves, providing for a device that has a lower capacitance relative to the preferred geometry of the emitter in Meta-Lasers operating above 10 THz (30 micron and shorter in terms of wavelength).

Exemplary Fabrication for the First Illustrative Meta-Laser Embodiment

The following detailed description presents one embodiment of a preferred fabrication procedure for first illustrative meta-laser embodiment consistent with the present subject matter. Those of relevant skill in the art will appreciate that certain modifications may be able to be made to the exemplary fabrication procedure disclosed below, without departing from the scope of the present application. Accordingly, by way of illustration, one embodiment of a fabrication procedure can substantially follow the procedure outlined for the nanoswitches, with some minor alterations. It can begin with a high-resistivity >10 kΩ [100] silicon substrate. 100 nm of $SiO_2$ can be coated onto the upper surface of the substrate via plasma-enhanced chemical vapor deposition. This can be followed by a 50 nm layer of $Si_3N_4$, provided to to help limit post-fabrication deformation. A second $SiO_2$ layer 350 nm layer can be deposited next. The elastic layer then can be annealed at 700° C. in flowing $N_2$ to eliminate trapped hydrogen. This can improve bonding to the next layer and help protect against structural weakening of the $SiO_2$ Next, 16 nm of Ti can be deposited followed by 9 nm of $TiO_2$. Then a 164 nm layer of Platinum can be deposited. Another 2 nm layer of $TiO_2$ can be deposited to serve as the template for (111) orientation of lead zirconate (PZT). This $TiO_2$ layer can be deposited at 500° C. using a multichamber cluster tool. A 500 nm layer of PZT can be deposited next. This can be followed by a 105 nm platinum layer. The corresponding described film stack is illustrated in FIG. 9. Ion or electron beam milling of the top layer of Pt can shapes the top electrode, connecting wire path, and electrical contact block (see, e.g. FIG. 12a). The cut depth is kept low enough that the bottom electrode should not be exposed during this first milling. A second milling can be used to shape the bottom layer of platinum creating the bottom electrode, connecting wire path, and electrical contact block (see, e.g. FIG. 12b). Access to the bottom contact block can be obtained using a wet etch consisting of $H_2O:HCl:HF$ (2:1:0.04) to locally remove the PZT (FIG. 12c). A reactive ion etch consisting of $CF_4$, $CHF_3$, and He can be used to open access to the Si substrate next (FIG. 12d). This procedure can substantially define the actuator.

A 1 nm layer of $SiO_2$ can be deposited and patterned to provide electrical isolation on the side wall and top surface of the actuator. A sacrificial organic layer can be spun onto the sample. Then etching through the organic and the silicon to create a channel with the shape of the Meta-Laser emitter element (SRR), contact blocks, and connecting wire paths for the power input and bias (FIG. 13) can be performed. The connecting wires are designed to be approximately 0.637 micron deep by 0.637 micron wide for the power source in the switch vicinity, widening further away from the device. The bias wire can be designed to be approximately 1 μm by 0.637 μm near the emitter and widening to approximately 10 μm further back. The presently disclosed geometry embodiment has been chosen so that these elements are substantially accommodating to fit in the area defined by the switch wires and contact block of the top electrode. The edges of the bias wire can mark the edges of an Si etch in a later step.

Figure 14:
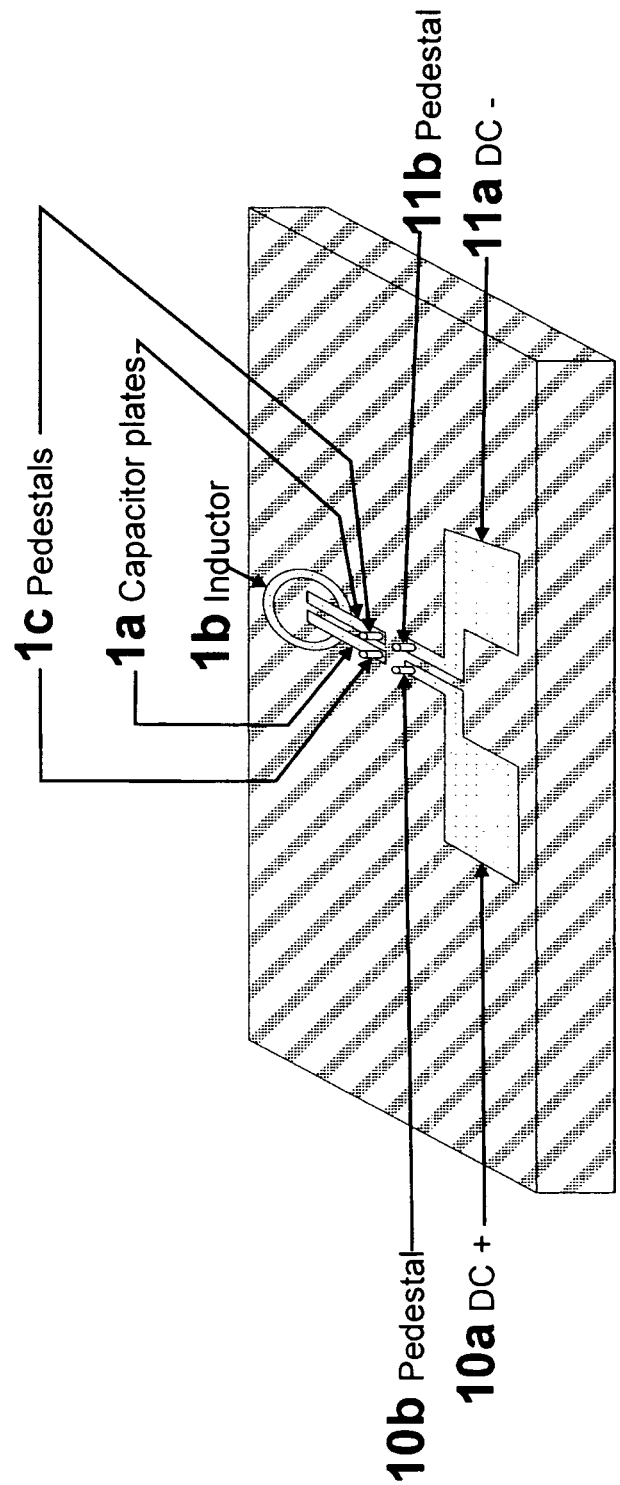
FIG. 14 shows the electrical supply circuit and an emitter in place in accordance with the present invention; where the Au of the circuit (10a, 11a, 1 a, 1b) has been milled to the height of the Si substrate except at the pedestal locations (1c, 10b, 11b). Unshown components may also include the bias circuit (12), the nanoswitches (2), and nanoswitch electrical actuation circuits (8, 9).

A layer of Au can be deposited to fill the Si channels created in the previous step. Then the Au can be carefully etched to disconnect the channel material from the organic suspended layer. The organic layer then can be removed with oxygen plasma. The gold of the Meta-Laser emitter and near the switch areas then can be milled down to substantially the height of the Si substrate, except at the contact dimple points, thus shaping the dimples (see, e.g., FIG. 14).

Figure 15:
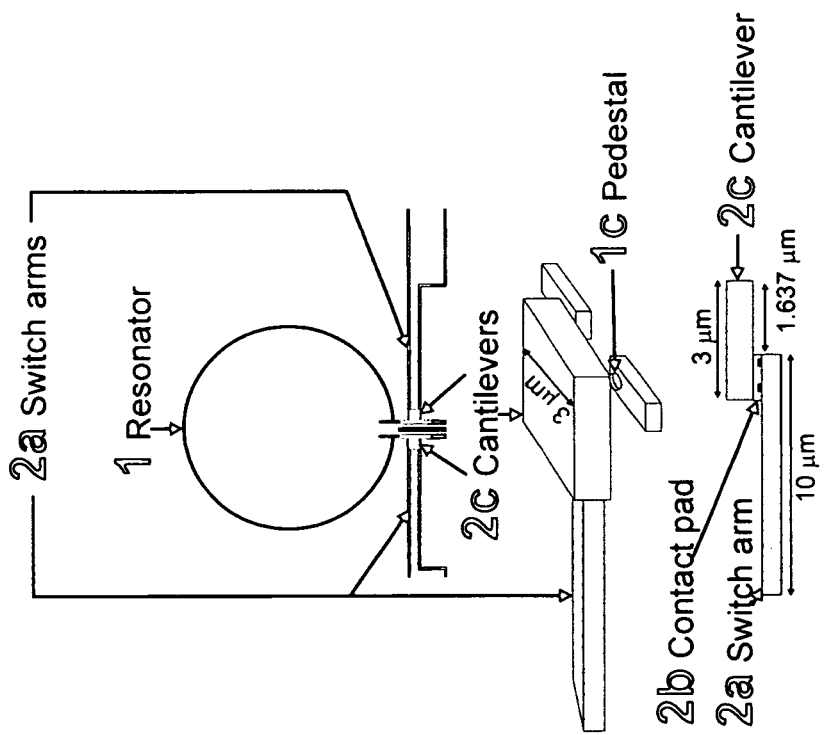
FIG. 15 shows—Top: top view of a cantilever (2c) in place. Middle: angled view of nanoswitch with cantilever arm in place. Bottom: side view of actuator and cantilever arm.

A 10 nm layer of Si can be deposited as a sacrificial layer to define the contact separation. Another organic sacrificial etch layer can be deposited and patterned for the cantilever. A 1000 nm layer of Au then can be deposited to and lift-off patterned to provide the conductive cantilever arm (see, e.g., FIG. 15).

The substantially final lithography step can be to undercut the actuator arm releasing it and removing the sacrificial Si layer to expose the dimples. This is done using an oxygen plasma and $XeF_2$.

Figure 16:
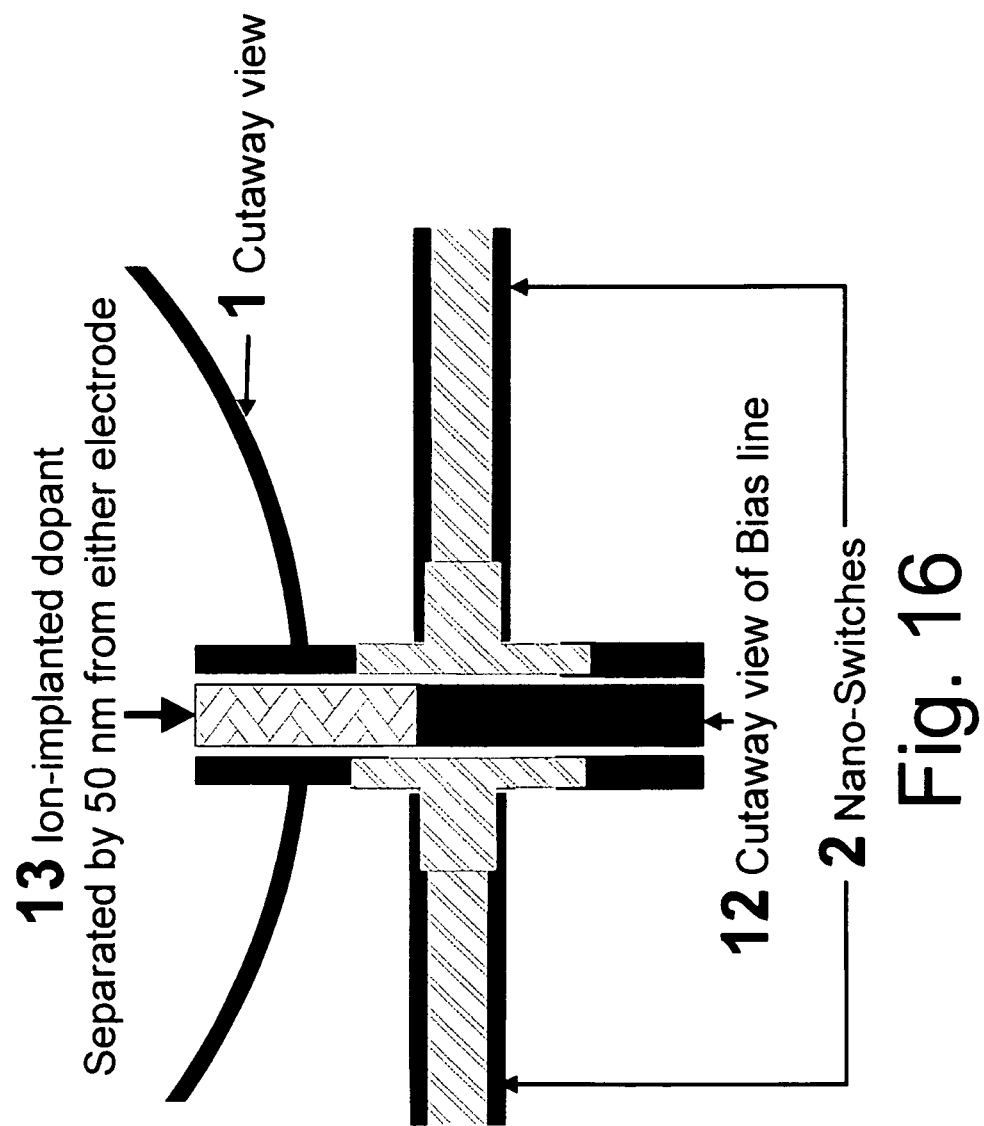
FIG. 16 shows the location (13) where ion beam implantation is used to inject phosphorus into a region to raise the carrier concentration to $3\times10^{21}/cm^3$ converting this region into an N type silicon.

I-beam ion implantation of the n-dopant (phosphorous) into the silicon biasing region can substantially complete the wafer fabrication steps (see, e.g. FIG. 16). A 50 nm wide zone can be left as an electrical barrier between the capacitor electrodes and the bias region to prevent device shorting. The ion implantation zone extends to the bias input conductor path.

The wafer then can be diced to 1 mm squares, each containing one meta-laser device. These can be mounted using a substantially thermally conductive adhesive on a metal substrate for thermal advantages. Said metal substrate could be Al, Cu, or preferably a thermo-electric cooler device, to name but three examples. The electrical ground for the bias can be isolated from all other electrical inputs and can be connected to this metal plate. The device can be micro-wired to the electrical connectors. Once complete, the device can be package mounted or direct-surface mounted on an electronics circuit board provided the operating environment of the circuit board or the package interior is preferably constructed such that the switches are preferably maintained in a partial pressure environment of approximately $10^{-10}$ Torr to avoid conductivity of the intervening gap. This is preferred for the ultrafast switching required ($t_{off} \leq 10^{-13}$ s). Otherwise, in air, due to the high electric field between contact surfaces in the switch, there can be electrical shorting and prolonged conductivity resulting in excessive $t_{off}$ and requiring very low operating voltages for switching. A heat sink and fan can be employed for high power operation.

It should be noted that the design of the device preferably mounts the device upside down, where gravity can, at least in part, assist in opening the nanoswitches, and thermal conduction is upward out of the device. For operation, a heat sink and fan can be mounted appropriately for operation, avoiding material blockage of the emitter front face.

Second Illustrative Embodiment

The following description presents a second illustrative embodiment of a meta-laser device consistent with the present subject matter, in particular, embodied, at least in part, as an optical meta-laser. The specifics discussed below are presented for illustrative purposes and are intended for facilitating discussion. They are not meant as a limitation on the claimed subject matter.

Figure 17:
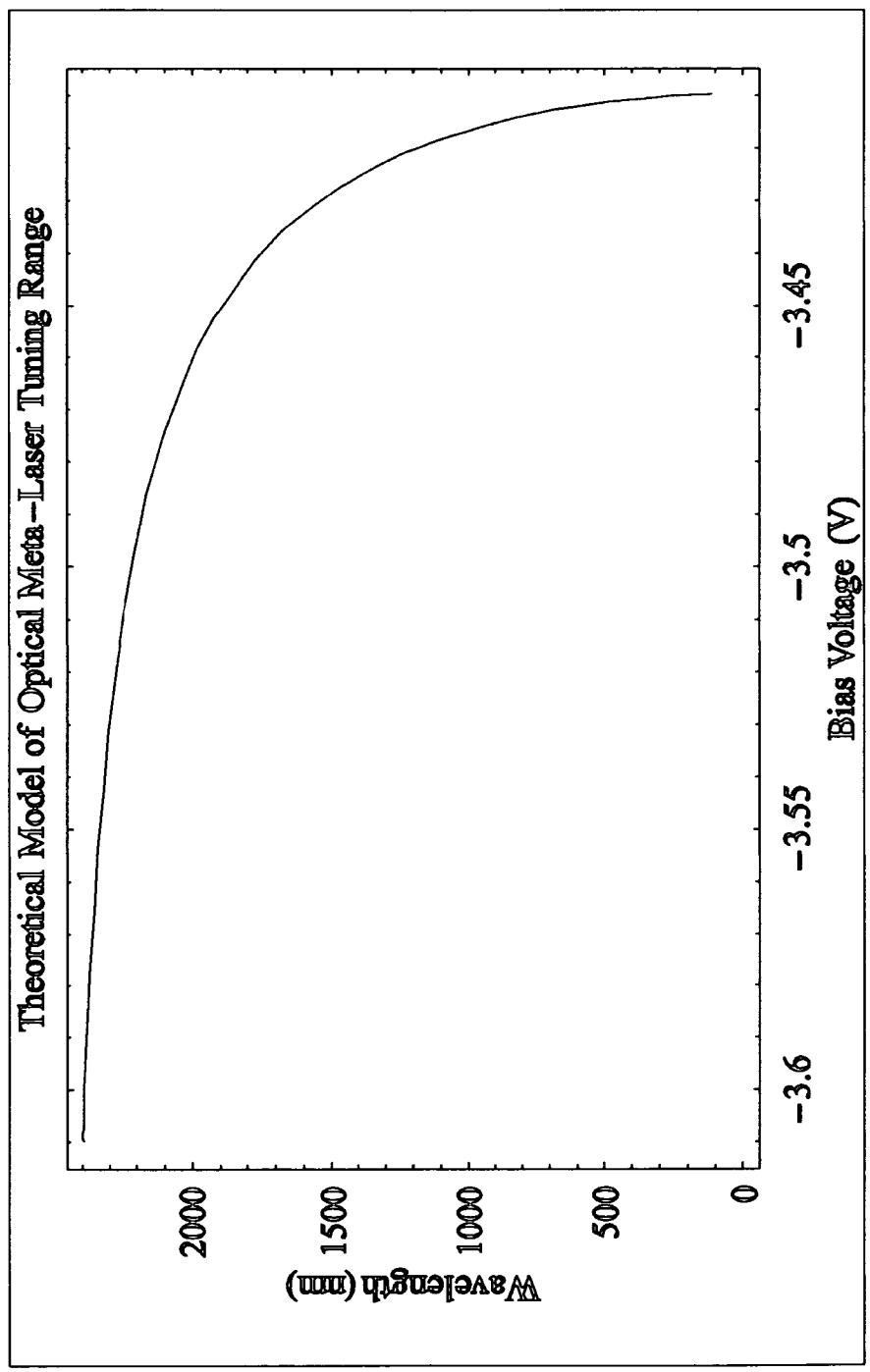
FIG. 17 shows the tuning range for an optical Meta-Laser in accordance with the present invention. The 199 mV tuning range spans the optical transparency window in ITO and most glasses.

For further discussion of the second illustrative embodiment, using BK-7 as a substrate, silver as the conductor, and indium tin oxide (ITO)[28] as the tunable dielectric, one can have suitable materials for constructing a meta-laser capable of generating electromagnetic waves substantially in, at least in part, the optical range. The reduced scaling parameters and heavy doping (as shown in Table 1 below) in device construction would expect to result in a device that would be tunable from approximately 451 to approximately 2487 nm. The bias range for this device is approximately −3.61 to approximately −3.411 V (see, e.g., FIG. 17).

[28] H. A.-H. Mohamed, H. M. Ali, "Characterization of ITO/CdO/glass thin films evaporated by electron beam technique", Sci. Technol. Adv. Mater., 2008.

TABLE 1

Optical Meta-Laser design parameters

| Parameter | Value |
|---|---|
| a | 17.2 nm |
| r | 667 nm |
| ℓ | 250 nm |
| N (doped) | $3 \times 10^{22}$ cm$^{-1}$ |

Figures 18A, 18B:
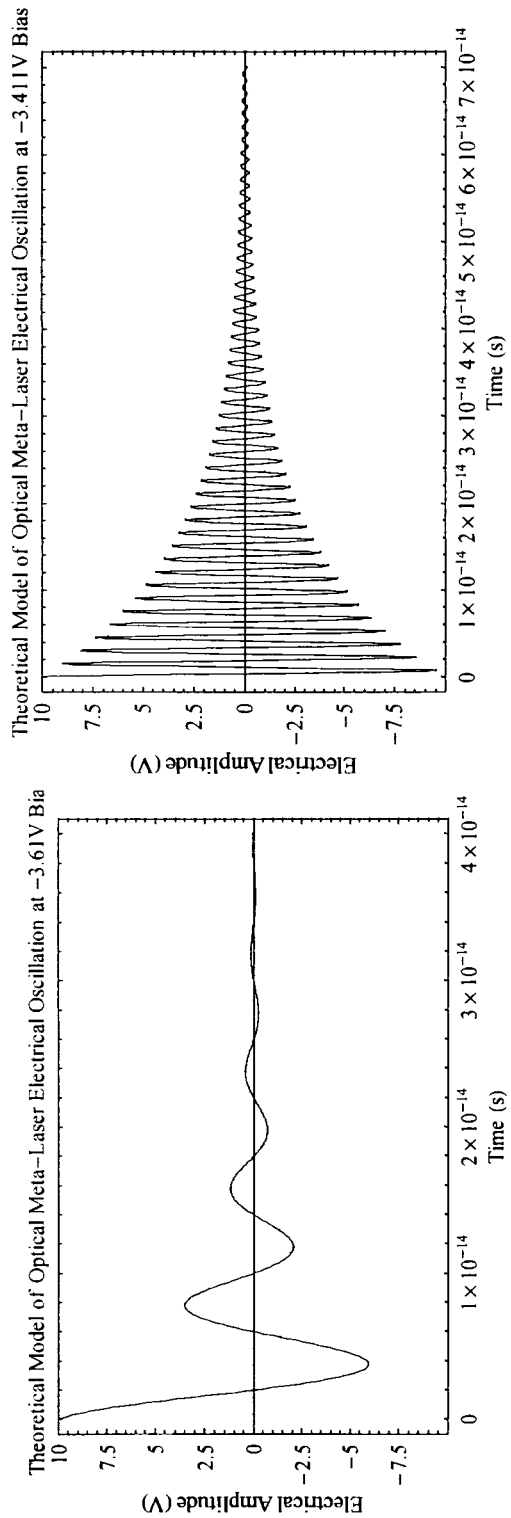
FIG. 18 shows a) an electrical oscillation at 2.5 μm; and b) oscillation at 450 nm in accordance with the present invention.

As is typical with the design of the present embodiments, the higher operating frequency is optimal for power production (see, e.g., FIG. 18).

In the THz example, mW average power output levels are considered desirable. In the visible to mid-IR range of this device, however, this may not be directly achievable. However, one could place a linear array of these devices spaced at twice the longest wavelength (5 μm spacing) and then the added mutual inductance between adjacent elements would be $$2\left(\frac{.667}{5}\right)^2 L = .00474L.$$

This is insignificant with respect to the previous calculations. The bias lines can be tied to the same control voltage and the input switching can be performed by the same timing signal as in the low capacitance switching devices. A resulting linear array can act as a tunable edge-emitting laser. Standard known techniques, such as focusing onto a spherical mirror or into an optical fiber (or other waveguide device) using either a cylindrical lens or mirror can produce a high-power Gaussian beam from the device output. In an approximately 10 mm long device, approximately 2000 elements can be arranged in the array resulting in a multi-watt ultrafast device, consistent with the present subject matter.

With the second illustrative embodiment, at least one aspect of construction is substantially reversed with respect to the first illustrative embodiment. It is expected that the piezoelectric nanoswitch substantially cannot be scaled down to the dimensions requisite for the second illustrative embodiment of meta-laser. Fortunately, with the GaAs version of the optoelectronic switch, with its smaller dimensions, the emitter capacitance is $4.73 \times 10^{-19}$ F. The capacitance of the optoelectronic switches for this case is $4.48 \times 10^{-20}$ F. These could be illuminated by (but not limited to) an approximately 808 nm laser diode since <870 nm (as per formula in FIG. 19a) can photo-ionize GaAs[29]. And, oscillation can commence when the laser diode turns off (see, e.g., FIG. 19b). For this second illustrative embodiment, one example of the switch off time, $t_{off}$, is less than 100 attoseconds.

[29] Sadao Adachi, "GaAs, AlAs, and AlxGa1-xAs@B: Material parameters for use in research and device applications", J. Appl. Phys. 58, 1985.

Exemplary Fabrication for the Second Illustrative Meta-Laser Embodiment

Figure 20:
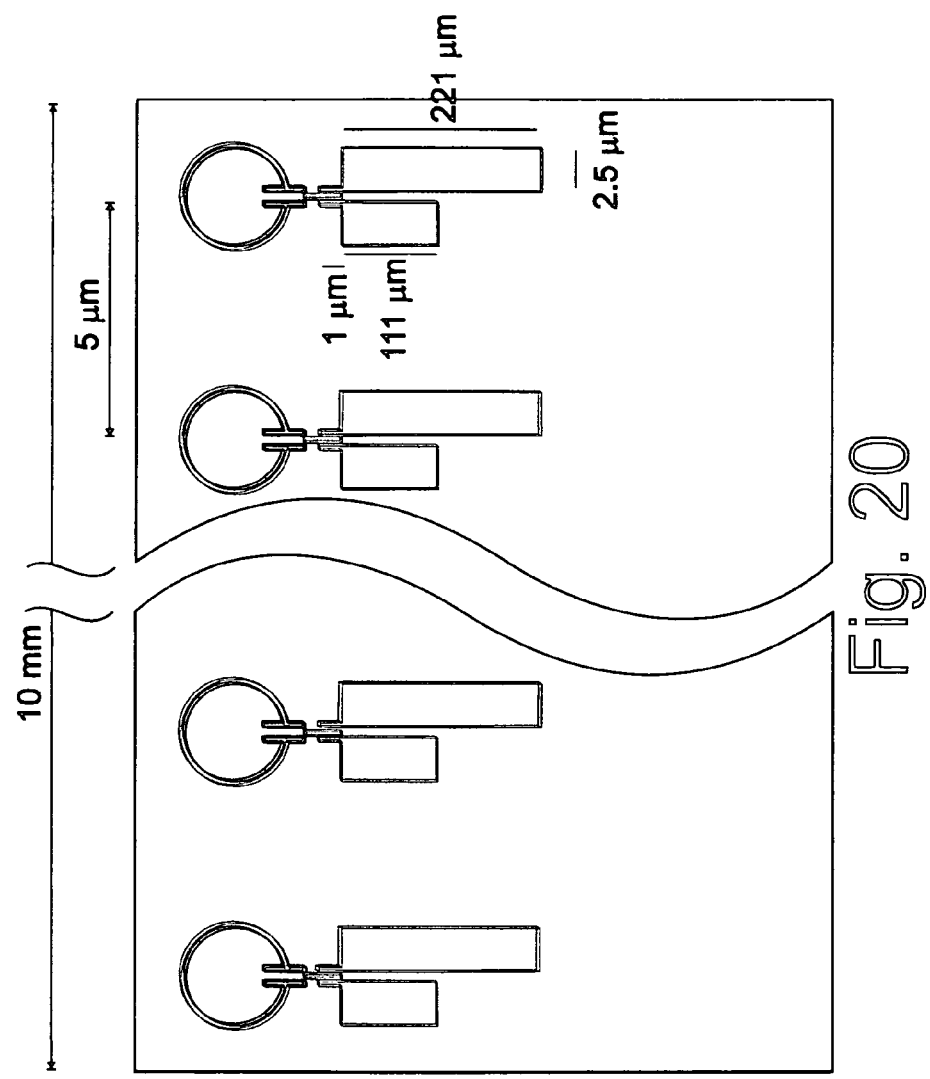
FIG. 20 shows a linear array device with channels cut to the specifications shown in Table 1. The gaps between the DC input and the emitters are 100 nm. (Drawing is not to scale to show features)

The following detailed description presents one embodiment of a preferred fabrication procedure for a second illustrative meta-laser embodiment consistent with the present subject matter. Those of relevant skill in the art will appreciate that certain modifications may be able to be made to the exemplary fabrication procedure disclosed below, without departing from the scope of the present application. Accordingly, by way of illustration, to commence with the present example of a fabrication procedure for the second illustrative meta-laser embodiment, a 1 μm sacrificial organic layer (as in the previous example) can be deposited on a BK-7 substrate. The BK-7 substrate can be ion-beam etched through the sacrificial layer using the previously mentioned reactive etch to open channels in the BK-7 similar to opening the Si, as in the previous example. Etching the linear array emitter channels and wire connector channels to a depth of 100 nm can prepare the device for Ag deposition (see, e.g., FIG. 20).

Figure 21:
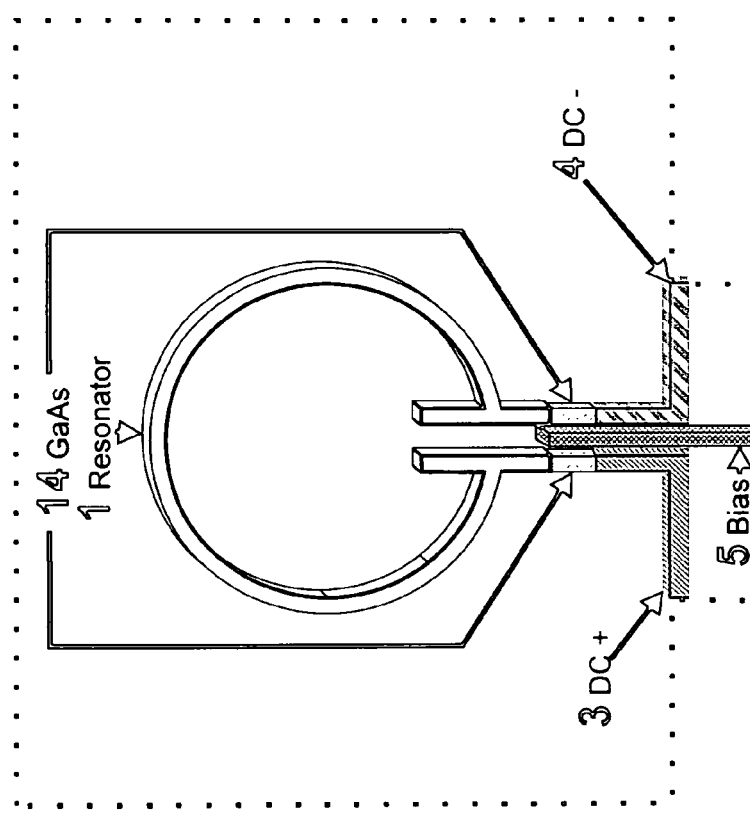
FIG. 21 shows an exploded area view of a single emitter (1) showing the 100 nm long 17.2 nm square wire Lt-GaAs (14) connecting the emitter with the DC voltage source.

A 172 angstrom layer of Ag can be sputtered onto the prepared wafer. Lift-off patterning of the Ag and removal of the organic layer can be performed to leave the conductive paths and device. Another 100 nm sacrificial layer can be deposited. E-beam lithography can be performed, at least in part, to open the optoelectronic switch locations for GaAs deposition. A 172 angstrom layer of LT-GaAs can be deposited by standard sputtering techniques substantially to form the switches. E-beam lithography can be used to disconnect the switch area from the unusable LT-GaAs layer. Lift-off of the GaAs layer and removal of the sacrificial layer can be done as previously indicated (see, e.g., FIG. 21).

Figure 22:
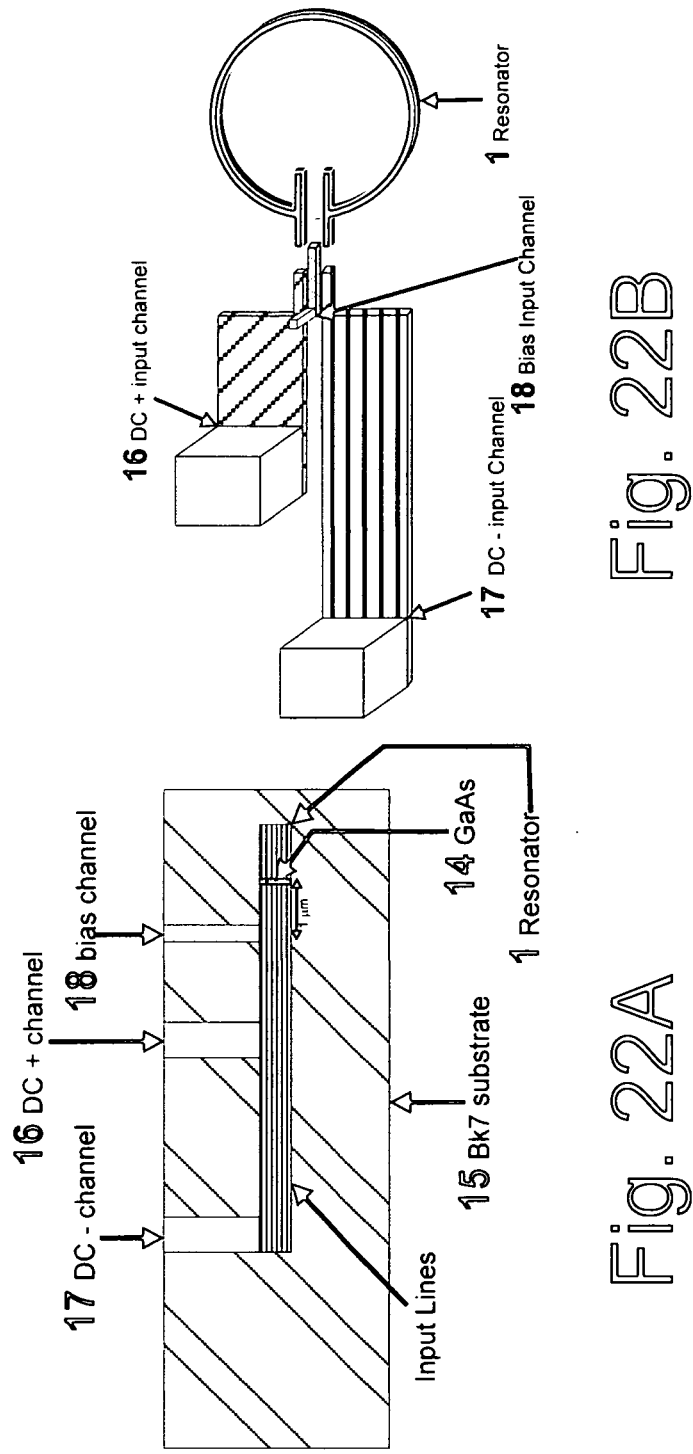
FIG. 22 shows a) Side view of vertical shafts. Bias channel (18) is 17.2 nm by 17.2 nm square. Other channels (16, 17) are 2.5 μm by 2.5 μm square. b) Top view showing vertical shafts.

Next, a 100 nm layer of $SiO_2$ can be deposited. This can help offer a protective insulator layer that helps provide the ability to use three dimensional separation of the bias and power input circuits while remaining transparent to (but not limited to) the approximately 808 nm switching input signal, and/or the wavelength λ, where $\lambda < \lambda_{photoionization}$ (the wavelength required for switching on the optoelectronic switch) from the optical source. Reactive ion etching to 200 nm depth in the $SiO_2$ and BK-7 substrate can help prepare the vertical conductor channels (see, e.g., FIG. 22).

Figure 23:
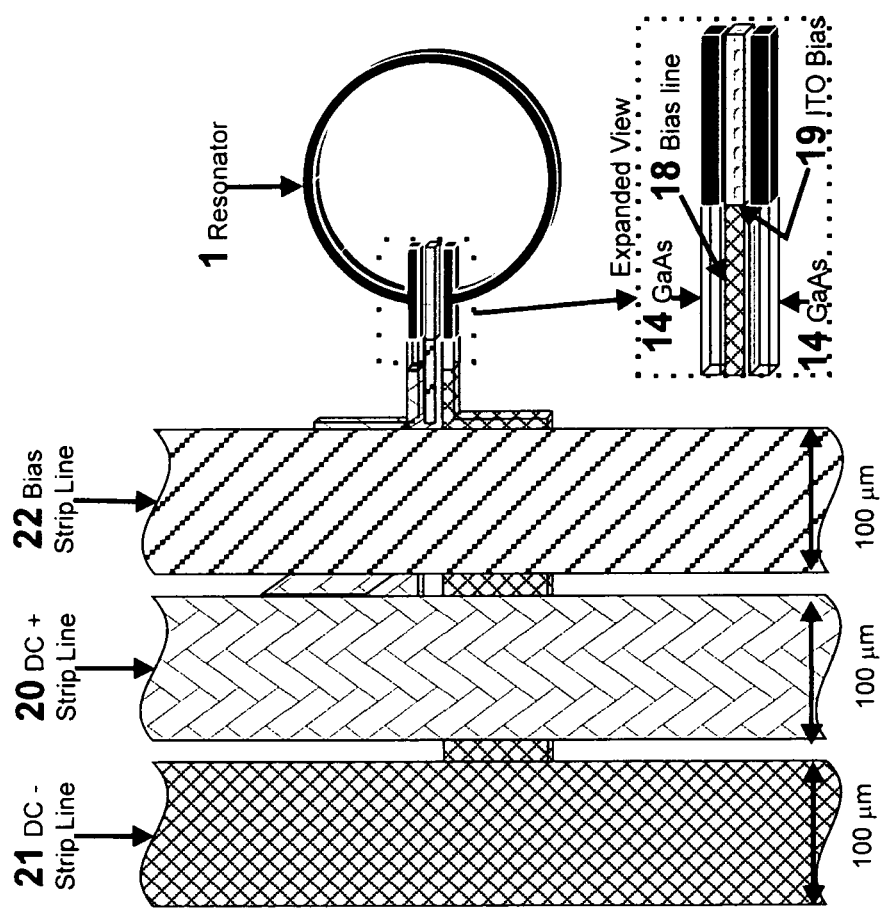
FIG. 23 shows strip lines (20-22) connecting linear array of emitter elements and the cut down channel are shown. Gold lines are 2 μm thick for current carrying capacity. Thick deposition also aids in smoothly filling in vertical shafts.

Continuing with the fabrication example, a 300 nm layer of Au can be deposited and patterned. Another 100 nm organic sacrificial layer can be deposited and then a reactive ion beam etch can be used to etch the 200 nm depth of the ITO bias material region in the BK-7 and $SiO_2$ (see, e.g., FIG. 23).

Figure 24:
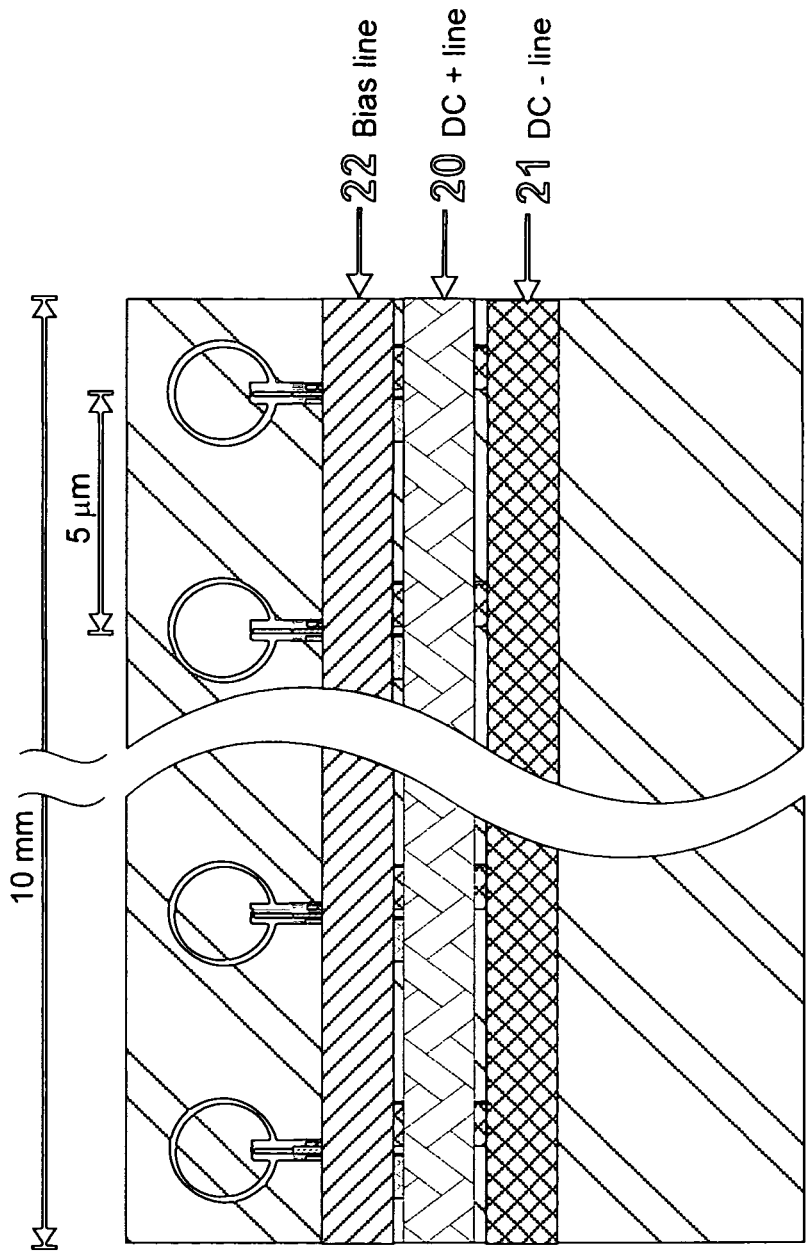
FIG. 24 shows completed 10 mm long linear array containing 2,000 optical emitting Meta-Laser elements designed to be simultaneously triggered via ultrafast optical pulse with a wavelength between 750 and 870 nm and with ≥10 MHz repetition rate.

172 angstroms of ITO doped with CdO to the $3\times10^{22}$ $cm^{-3}$ carrier concentration level can be deposited as per Pendry[11] This can be followed by 1828 angstroms of $SiO_2$. The $SiO_2$ can be reactive-etched to separate the ITO cap from the unused layer. The unused layer can be lifted off, and the organic layer can be removed by oxygen plasma as previously indicated (see, e.g., FIG. 24).

Once completed, the wafer can be diced and packaged similar to as indicated in the first illustrative embodiment previously described. In this second illustrative embodiment, a laser diode can be mounted with an appropriate lens. A grating can be added to improve optical pumping efficiency of the switches[30]. The laser diode and optics can be provisioned, located, positioned, and/or otherwise permanently, semi-permanently, or temporarily fixed in a package relative to the optical meta-laser device to operate the optoelectronic switches.

[30] R. Nagarajan, "Diffractive optics in optoelectronic switching", University of Alberta Ph.D. dissertation, 1997.

As those skilled in the art will appreciate, appropriately suitable materials and geometry can similarly be used to produce devices operating in the far- and mid-IR (100 μm-2.5 μm) intervening ranges between the two operational ranges applicable to the previous two illustrative meta-laser embodiments.

Third Illustrative Embodiment

For illustration, and not by way of limitation, a third illustrative embodiment of the present subject matter can be configured as a tunable terahertz wave generation device employing optoelectronic switching mechanisms to generate variable frequency waves ranging from approximately 94 GHz to approximately 1.64 THz. For construction of such a third embodiment, appropriately configured and/or sized components can be employed. For example, an suitable emitter can be configured wherein the inductor has a radius advantageously substantially optimized for 1.5 THz generation (e.g., r=approximately 37.5 microns). A larger capacitor, with a length of approximately 10 microns and a gap of approximately 2.02 microns, employing a bias zone with a carrier density of approximately $10^{21}$ $cm^{-3}$, with the other details substantially unchanged from those described in the first illustrative embodiment above, can result in a device with sufficiently large capacitance (e.g., $2.69\times10^{-16}$ F) substantially suitable for inclusion in a device operating from approximately 94 GHz to approximately 1.64 THz utilizing optoelectronic switches. Accordingly, it should be readily appreciated that utilizing the material recently developed for photoconductive switching[31], currently available optoelectronic switches are generally acceptable for <2 THz peak frequency devices such as the 1.5-THz-encompassing third illustrative embodiment presently described.

[31] R. J. B. Dietz, M. Gerhard, J. Boettcher, et. Al., "Photoconductive THz generation at 1.5 μm excitation in InGaAs/InAlAs structures with separated photoconductive and trapping layers", Conf. Proceedings IRMMW-THz 2011, M4A.4, 2011.

Figure 25:
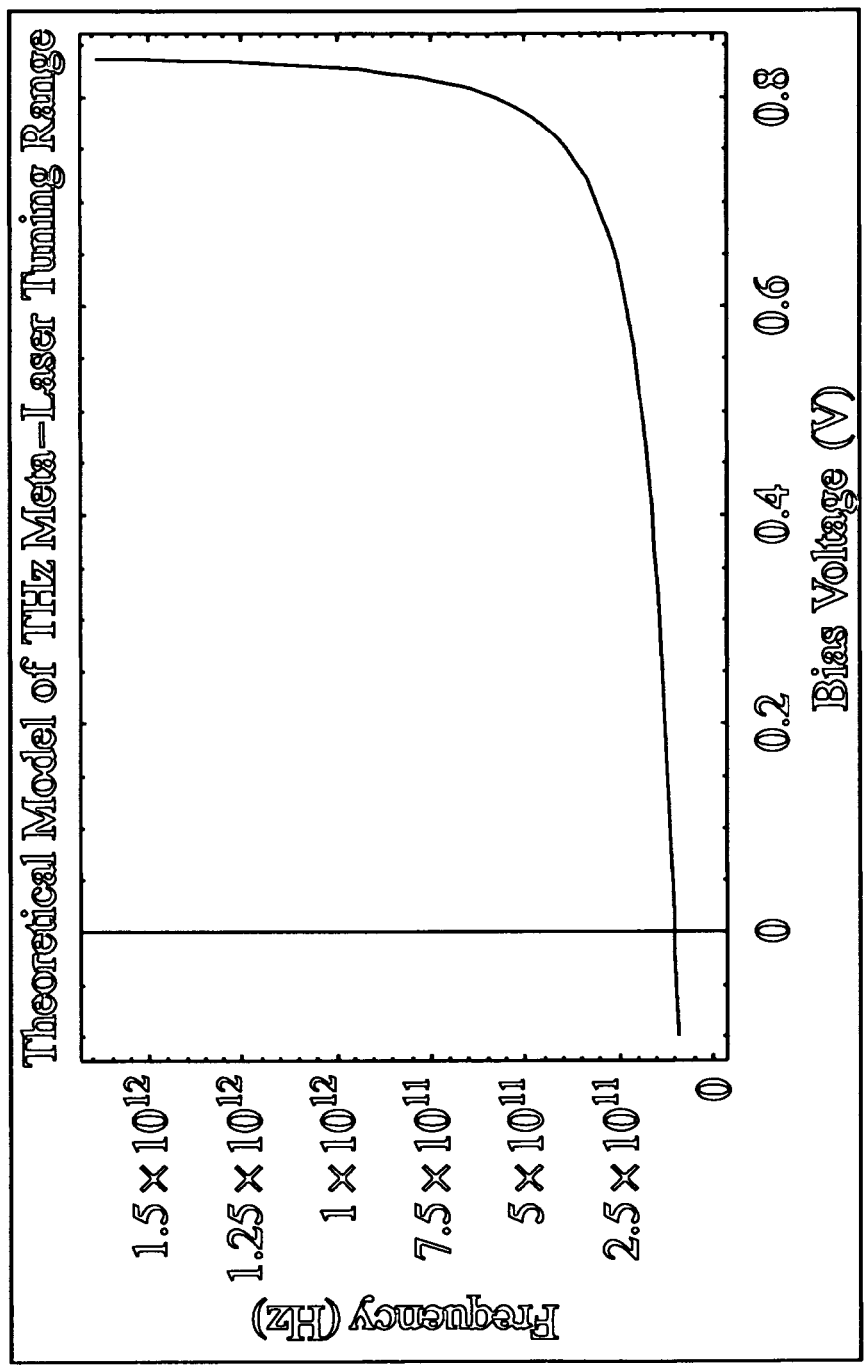
FIG. 25 shows the spectral operating range from bias control for the 1.5 THz Meta-Laser.
Figure 26:
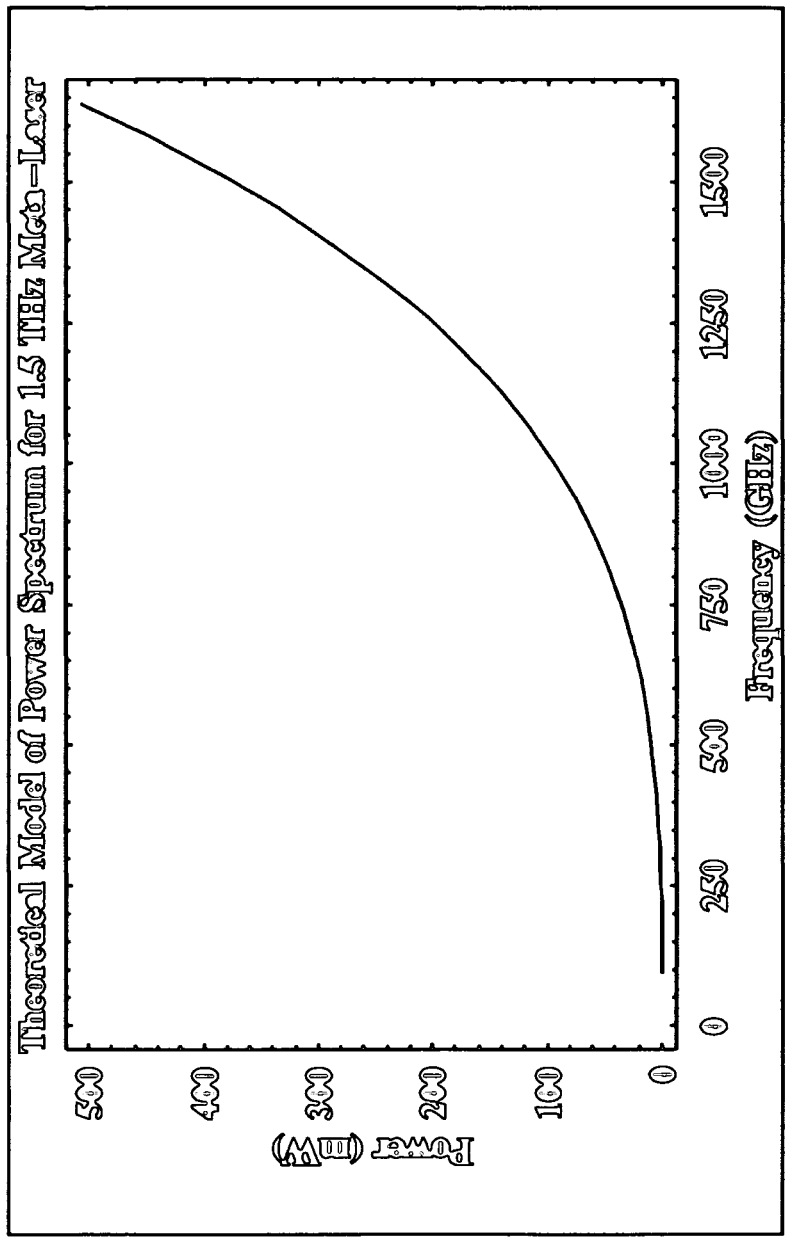
FIG. 26 shows the power spectrum for the 1.5 THz Meta-Laser.

The operating spectral range for this device where the first oscillation is at least 10% of the input voltage is approximately 94 GHz. The spectral range is shown in FIG. 25. At 100 MHz repetition rate with 80 W input power, the output at 1.64 THz is approximately 500 mW for close to 0.6% efficiency (see, e.g., FIG. 26). The radiation pattern is substantially unchanged in the far field. Actuation by optical source (whether laser diode, fiber laser or other ultrafast source) is similar to that described with respect to the second illustrative embodiment, with the required $t_{off}$ approximately 100 femtoseconds for this example.

Exemplary Fabrication for the Third Illustrative Meta-Laser Embodiment

Figure 27:
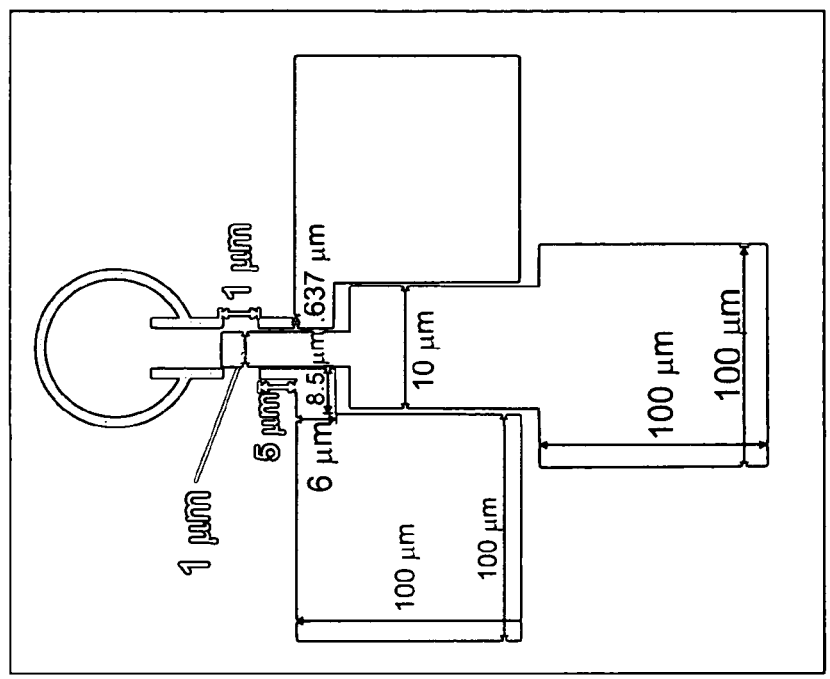
FIG. 27 shows the etch mask layout for the Au channels to be cut for the emitter (1), conducting portion of the DC input circuits (10, 11), and bias circuit (12).

The following detailed description presents one embodiment of a preferred fabrication procedure for a third illustrative meta-laser embodiment consistent with the present subject matter. Those of relevant skill in the art will appreciate that certain modifications may be able to be made to the exemplary fabrication procedure disclosed below, without departing from the scope of the present application. Accordingly, by way of illustration, to commence with the present example of a fabrication procedure for the third illustrative meta-laser embodiment fabrication can begin by $XeF_2$ etching the circuit pattern illustrated in FIG. 27 into a Si wafer with [1 0 0] orientation to a depth of at least 2 microns. Deposition of $SiO_2$ to a typical depth (but not limited to) approximately 100 nm can provide a protective layer, to help prevent the GaAs from n-doping the Si substrate. Au can be deposited and patterned with a standard liftoff technique known in the art. Afterwards, InGaAs/InAlAs can be deposited and patterned into the switch areas as per Woodward[17] Then $SiO_2$ can be deposited on top of the switch to substantially seal it. A layer of thermally conductive metal, such as Al or Cu, as but two examples, or other suitable material, can be deposited on the bottom of the wafer as described with respect to the first illustrative embodiment example disclosed above. The $SiO_2$ can be etched to uncover the Si in the region of the emitter. Once fabrication of the layers is complete, the wafers can be diced, and the components can be microwired and packaged appropriately as previously disclosed, with respect to the first illustrative embodiment.

Fourth Illustrative Embodiment

For purposes of further facilitating discussion, and, at least in part, to help highlight the robust applicability of embodiments consistent with the present subject matter, a fourth illustrative embodiment of a meta-laser can be constructed so as to encompass, at least in part, a combination device, combining emission characteristics of the first and/or third illustrative embodiments described above (generating, at least in part, terahertz range waves) with emission characteristics of the second illustrative embodiment described above (representing an optical meta-laser). For one embodiment of such a device, a layer of THz-transparent material, such as silicon, can be placed on top of part of the device on one side and a THz emitter can be built side by side with the optical array. With such embodiment, one could employ simultaneous timing between the two emitter components and build a source for applications such as narrowband THz nonlinear spectroscopy, where the THz is the pump and the optical signal is the probe, pump-probe experiments, where the THz pumps the system and the optical probes, or nonlinear imaging techniques. Such a high-power pulsed system, consistent with the present subject matter, can be ultra-compact compared to existing sources such as used by Toptica and Menlo systems, and produce orders of magnitude more THz output. With the higher output of this invention real-time THz imaging or coherent spectroscopy and/or tomography would be an available option.

Exemplary Fabrication for the Fourth Illustrative Meta-Laser Embodiment

The following detailed description presents one embodiment of a preferred fabrication procedure for a fourth illustrative meta-laser embodiment consistent with the present subject matter. Those of relevant skill in the art will appreciate that certain modifications may be able to be made to the exemplary fabrication procedure disclosed below, without departing from the scope of the present application. Accordingly, by way of illustration, to commence with the present example of a fabrication procedure for the fourth illustrative meta-laser embodiment, a $SiO_2$ substrate, as employed with the Optical Meta-Laser, can be etched to provide a deposition region for the silicon required for the THz component and properly masked accordingly. [1 0 0] Si can be epitaxially grown on this region. Then the appropriate processes can be used to construct the THz Meta-Laser component, as was described with respect to the third illustrative embodiment above. Afterwards, the masking material can be removed to expose the $SiO_2$ where the Optical Meta-Laser is to be constructed. The process for the Optical Meta-Laser component can be followed with appropriate masking of the THz Meta-Laser component while protecting the previous fabrication using resists, as done in a customary fashion.

Completed wafers can be diced, microwired, and packaged in standard fashion, while leaving the top exposed through a window of material that is substantially transparent to the near infrared (or other suitable switching source employed) for switching the device, as previously described with respect to the second and third illustrative embodiments. Any substantially suitable optical source characterized by having both a sufficiently fast switch off time, $t_{off}$, and a wavelength short enough to photoionize the optoelectronic switch material (as per the second and third illustrative examples above) can be employed.

As previously indicated, the preceding description of alternative illustrative embodiments has been presented for purposes of facilitating discussion, and the claimed subject matter is not meant to be limited to the specific embodiments described. Rather, those skilled in the art will fully appreciate that alternative embodiments not fully described herein may also be included within the scope of the claimed subject matter. As but one example of such alternatives, modifying the illustrative meta-laser embodiments previously described by omitting the steps to insert doped silicon for tuning and omission of the bias circuit in the etch pattern, can substantially results in the construction of a fixed frequency device for fixed frequency imaging or other advantageous applications. By omitting the tuning circuit, an appropriately selecting component sizing, configuration, and geometry, one can construct one or more fixed-frequency versions of a meta-laser device. Such fixed frequency device can be designed to operate at the optimal frequency for maximum power generation and can function as a preferred embodiment to commercially available quantum cascade laser, with the added benefit of exhibiting room-temperature operating characteristics. This would make the fixed frequency version superior to QCLs below the 4.3 THz range, where QCLs require cryogenic cooling. Additionally, QCLs are currently not available for use below the 1 THz range, as this range is beyond the state of the art now known and/or anticipated in the foreseeable future, do to noise limitations inherent in the design of QCLs [4]. Consistent with the present subject matter, fabricating fixed frequency meta-lasers to frequencies below 1 THz is substantially straightforward, as the circuit characteristics are larger and easier to construct by standard microfabrication techniques. Such advantageous devices can be made relatively conveniently available and/or readily applied to single frequency imaging and/or other potential uses.

It will be obvious to those having skill in the art that many changes may be made to the details of the above-described embodiments without departing from the underlying principles of the invention. The scope of the present invention should, therefore, be determined only with respect to the following claims.

REFERENCES CITED

The references listed in the following table may contain exemplary procedural or other details supplementary to those set forth in the above description. Accordingly, each reference cited in Table 2 below, as well as any additional reference cited in a footnote herein, is hereby incorporated by reference in its entirety.

TABLE 2

Listing of References

| Table Ref. # | Reference |
|---|---|
| 1 | W. C. Hurlbut, V. G. Kozlov, "Extended spectral coverage of BWO combined with frequency multipliers", conf. proceedings Photonics West, 2010. |
| 2 | T. W. Crowe, J. L. Hesler, R. A. Retslov, et. al., Solid state LO sources for greater than 2 THz", 2011 ISSTT digest, $22^{nd}$ symposium on space terahertz technology, 2011. |
| 3 | E. R. Mueller, "Optically-pumped THz laser technology", Coherent lasers Inc. |
| 4 | P. F. Tekavec, W. C Hurlbut, V. G. Kozlov, et. al., "Terahertz generation from quasi-phase matched gallium arsenide using a type-II ring cavity optical parametric oscillator", Cong. Proceedings Photonics West, 2011. |
| 5 | L. S. Rothman, HITRAN database, Atomic and molecular physics division, Harvard-Smithsonian center for astrophysics, 2008. |
| 6 | N. Oda, M. Sano, K. Sonada, et. al., "Development of terahertz focal plane arrays and handy camera", Conf. proceedings SPIE Infrared technology and applications, Apr. 25, 2011. |
| 7 | M. Bolduc, M Terroux, B. Tremblay, et. al., "Noise-equivalent power characterization of an uncooled microbolometer-based THz imaging camera", Conf. proceedings SPIE |
| 8 | H. L. Mossbacker, J. Alverbro, Z. Zhang, et. al., " Initial test results for a real-time 80 × 64 pixel, 600 GHz-1.2 THz imager", Conf. proceedings IRMMW-THz 2011, Oct. 2-7, 2011. |
| 9 | R. M. Woodward, B. E. Cole, V. P. Wallace, et. al., "Terahertz pulse imaging in reflection geometry of human skin cancer and skin tissue", Physics in Medicine and Biology, Vol. 47 (21), 2002. |

TABLE 2-continued

Listing of References

| Table Ref. # | Reference |
|---|---|
| 10 | J. C. Maxwell, A Treatise on Electricity and Magnetism, Dover (1904). |
| 11 | Pendry, J. B.; Holden, A. J.; Robbins, D. J.; Stewart, W. J., "Magnetism from conductors and enhanced nonlinear phenomena". IEEE Transactions on Microwave Theory and Techniques 47 (11): 2075. |
| 12 | B. Jitha, C. S. Nimisha, C. K. Aanandan, P. Mohanan, K. Vasudevan, "SRR loaded waveguide band rejection filter with adjustable bandwidth", Microwave Opt. Technol. Lett. 48: 1427-1429, 2006. |
| 13 | H.-T. Chen, W. J. Padilla, J. M. O. Zide, et. Al., "Active terahertz metamaterial devices," Nature 444,597 (2006). |
| 14 | H.-T. Chen, A. K. Azad, J. F. O'Hara, et. Al., "Active Terahertz Metamaterials", Conf. Proceedings IRMMW-THz 2011, Tu-1.2, 2011. |
| 15 | B. S. Williams, "Terahertz quantum cascade lasers", Nature Photonics, vol. 1, September 2007. |
| 16 | P. Zorabedian, F. J. Duarte., Tunable Lasers Handbook, Academic Press, 1995. |
| 17 | B. Van Zeghbroeck, Principles of electronic devices, Univ. of Colorado, 2011. |
| 18 | Y. Yuan, C. Bingham, T. Tyler, "Dual-band planar electric metamaterial in the terahertz regime", Opt. Exp. Vol. 16 (13), 2008. |
| 19 | Thomas H. Hand and Steven A. Cummer, "Frequency tunable electromagnetic metamaterial using ferroelectric loaded split rings", J. Appl. Phys. 103, 066105 2008. |
| 20 | H. A.-H. Mohamed, H. M. Ali, "Characterization of ITO/CdO/glass thin films evaporated by electron beam technique", Sci. Technol.Adv. Mater., 2008 |
| 21 | J. D. Jackson, Classical electrodynamics, John Wiley & Sons, 3rd edition, 1998. |
| 22 | D. C. Judy, J. S. Pulskamp, R. G. Polcawich, and L. Currano, "Piezoelectric nanoswitch", IEEE 22nd Intern. Conf. on MEMS, Mar. 27 (2009). |
| 23 | Z.-M. Li, L. M. Veilleux, D. R. Conn, et. Al., 'Analysis of a resonant-cavity enhanced GaAs/AlGaAs MSM photodector", IEEE Phot. Techn. Lett., Vol. 4, (5), May 1992. |
| 24 | R. J. B. Dietz, M. Gerhard, J. Boettcher, et. Al., "Photoconductive THz generation at 1.5 μm excitation in InGaAs/InAlAs structures with separated photoconductive and trapping layers", Conf. Proceedings IRMMW-THz 2011, M4A.4, 2011. |
| 25 | Sadao Adachi, "GaAs, AlAs, and AlxGa1-xAs@B: Material parameters for use in research and device applications", J. Appl. Phys. 58, 1985. |
| 26 | R. Nagarajan, "Diffractive optics in optoelectronic switching", University of Alberta Ph.D. dissertation, 1997. |
| 27 | J. C. Iriarte, D. Etayo, I Palacios, et. al., "Water content evolution in leaves based on active terahertz imaging", Conf. proceedings Antennas and Propagation (EUCAP), Apr. 11-15, 2011. |
| 28 | D. A. Wikner, "Progress in millimeter-wave imaging", Conf. proceedings SPIE, Feb. 16, 2011. |
| 29 | J. F. Federici, B. Schulkin, F. Huang, et. al., "THz imaging and sensing for security applications-explosives, weapons, and drugs", Semiconductor Science and Technology, Vol. 20 (7), 2005. |

The invention claimed is:

1. A solid state device comprising:
a split-ring resonator having a first and a second capacitor electrode;
a doped region located between the first and the second capacitor electrodes;
a first electrical switch connected to the first capacitor electrode;
a second electrical switch connected to the second capacitor electrode;
a DC current source, wherein the anode is connected to the first switch and the cathode is connected to the second switch,
wherein the split-ring resonator circuit is connected across the DC current source when the first and the second electrical switches are actuated, thereby charging the resonator; and
wherein the split-ring resonator circuit is isolated when the first and second electrical switches are not actuated, thereby place the resonator in ring down lasing mode.

2. The solid state device of claim 1, wherein the solid state device is capable of generating coherent electromagnetic radiation.

3. The solid state device of claim 1, wherein the device is electronically tunable across a broad spectral range of approximately 500-3000 GHz, 94-1640 GHz, or 2.5 micron to 450 nm.

4. The solid state device of claim 1, wherein the device provides a high average power of > approximately 10 mW when the peak frequency is between 100 GHz and 10 THz or > approximately 1 W at 450 nm for devices operated between 2.5 microns and 450 nm.

5. The solid state device of claim 1, wherein the device provides a high peak power of less than 100 W.

6. The solid state device of claim 1, wherein the device provides a narrow spectral bandwidth of <300 GHz.

7. The solid state device of claim 1, wherein the device has a high spectral power density of > approximately 100 μW/GHz at peak frequency for devices with a peak frequency in the 100 GHz to 10 THz range, or >0.1 mW/nm for devices with shortest wavelength in the 2500-450 nm range.

8. The solid state device of claim 1, wherein the device is thermally cooled by air, fluid, cryogenic fluid, or by Peltier effect.

9. The solid state device of claim 1, wherein with a reflecting surface is positioned sufficiently far behind the split-ring resonator to reflect the backwards propagating wave after oscillation has ceased, thereby avoiding interference effects.

10. The solid state device of claim 1, wherein the device generates radiation between about 500 GHz and about 30 THz.

11. The solid state device of claim 10, wherein the device generates radiation between about 100 GHz and about 3 THz.

12. The solid state device of claim 1, wherein the electrical switches are piezoelectric nanoswitches.

13. The solid state device of claim 1, wherein the device has a spectral linewidth optimally covering atmospheric spectral windows at approximately 650 GHz, 850 GHz, 1.5 THz and 1.9 THz.

14. The solid state device of claim 1, wherein the electrical switches are optoelectronic switches driven by a high repetition rate optical source of approximately ≥1 MHz with sufficiently short enough wavelength to operate the switches and sufficiently short switch off time less than ring-down time of the circuit.

15. The solid state device of claim 14 wherein the device is capable of operating below 2 THz or above 30 THz (10 μm wavelength) to a frequency of 666 THz (wavelength of 450 nm).

16. A linear array of a plurality of the device of claim 1, synchronously actuated to produce a coherent high power signal.

17. A linear array of a plurality of the device of claim 1, synchronously actuated to produce radiation in different spectral ranges as a source for nonlinear imaging, nonlinear spectroscopy, pump-probe measurements, and coherent tomography.

18. The solid state device of claim 14, wherein the wavelength to operate the switches is approximately 808 nm for GaAs, and the switch off time is ≤approximately 100 femtoseconds for a device operating at 1.5 THz.

19. The solid state device of claim 14, wherein the high repetition rate optical source is chosen from a group including approximately 34 MHz, approximately 86 MHz and approximately 100 MHz.

* * * * *